(12) United States Patent
Tsai et al.

(10) Patent No.: US 9,508,791 B2
(45) Date of Patent: Nov. 29, 2016

(54) SEMICONDUCTOR DEVICE HAVING A METAL GATE

(71) Applicant: TAIWAN SEMICONDUCTOR MANUFACTURING COMPANY, LTD., Hsinchu (TW)

(72) Inventors: Tsung-Chieh Tsai, Chu-Bei (TW); Yung-Che Albert Shih, Hsinchu (TW); Jyh-Kang Ting, Baoshan Township (TW); Juing-Yi Wu, Hsinchu (TW); Liang-Yao Lee, Taoyuan (TW)

(73) Assignee: TAIWAN SEMICONDUCTOR MANUFACTURING COMPANY, LTD. (TW)

( * ) Notice: Subject to any disclaimer, the term of this patent is extended or adjusted under 35 U.S.C. 154(b) by 0 days.

(21) Appl. No.: 14/990,016

(22) Filed: Jan. 7, 2016

(65) Prior Publication Data

US 2016/0133693 A1 May 12, 2016

Related U.S. Application Data

(60) Division of application No. 14/303,024, filed on Jun. 12, 2014, now Pat. No. 9,236,379, which is a continuation-in-part of application No. 14/189,257, filed on Feb. 25, 2014, now Pat. No. 9,230,962, which is a division of application No. 13/247,286, filed on Sep. 28, 2011, now Pat. No. 8,685,808.

(51) Int. Cl.
*H01L 29/06* (2006.01)
*H01L 27/088* (2006.01)
*H01L 21/8238* (2006.01)
*H01L 29/66* (2006.01)
*H01L 21/762* (2006.01)
*H01L 27/02* (2006.01)
*H01L 27/092* (2006.01)
*H01L 29/49* (2006.01)
*H01L 29/78* (2006.01)
*H01L 29/165* (2006.01)

(52) U.S. Cl.
CPC ..... *H01L 29/0607* (2013.01); *H01L 21/76224* (2013.01); *H01L 21/823807* (2013.01); *H01L 21/823814* (2013.01); *H01L 21/823828* (2013.01); *H01L 27/0207* (2013.01); *H01L 27/088* (2013.01); *H01L 27/092* (2013.01); *H01L 29/0649* (2013.01); *H01L 29/4966* (2013.01); *H01L 29/66545* (2013.01); *H01L 29/165* (2013.01); *H01L 29/7848* (2013.01)

(58) Field of Classification Search
None
See application file for complete search history.

(56) References Cited

U.S. PATENT DOCUMENTS

| | | |
|---|---|---|
| 6,303,418 B1 | 10/2001 | Cha et al. |
| 6,562,713 B1 | 5/2003 | Belyansky et al. |
| 6,635,535 B2 | 10/2003 | Hao |
| 7,259,432 B2 | 8/2007 | Tamaru |
| 8,629,515 B2 | 1/2014 | Yeh |
| 8,685,808 B2 | 4/2014 | Tsai |
| 9,418,994 B1 * | 8/2016 | Chao ............... H01L 27/0886 |
| 2005/0194637 A1 | 9/2005 | Tamaru |

(Continued)

*Primary Examiner* — Thao P Le
(74) *Attorney, Agent, or Firm* — Hauptman Ham, LLP

(57) ABSTRACT

A semiconductor device comprises a non-conductive gate feature over a substrate, and a metal gate electrode over the substrate. The metal gate electrode comprises a portion over an active region of the substrate, and a portion over an isolation feature of the substrate ending at an end cap. A vertical profile of the metal gate electrode at the end cap matches a vertical profile of the metal gate electrode in the portion over the active region.

20 Claims, 27 Drawing Sheets

(56) References Cited

U.S. PATENT DOCUMENTS

| | | |
|---|---|---|
| 2005/0224830 A1 | 10/2005 | Blonder et al. |
| 2007/0166914 A1 | 7/2007 | Chen |
| 2008/0237663 A1 | 10/2008 | Hanafi |
| 2008/0305599 A1 | 12/2008 | Chuang et al. |
| 2011/0159678 A1 | 6/2011 | Hsu et al. |
| 2011/0186937 A1 | 8/2011 | Scheiper |
| 2011/0193179 A1 | 8/2011 | Fung et al. |
| 2011/0195549 A1 | 8/2011 | Chuang et al. |
| 2011/0215404 A1 | 9/2011 | Zhu et al. |
| 2011/0227167 A1 | 9/2011 | Chuang et al. |
| 2011/0233683 A1 | 9/2011 | Chuang |
| 2012/0025329 A1 | 2/2012 | Wu et al. |
| 2012/0086078 A1* | 4/2012 | Anderson ......... H01L 21/76283 257/347 |
| 2012/0126295 A1* | 5/2012 | Edge ................. H01L 21/82380 257/288 |
| 2012/0211808 A1* | 8/2012 | Wei ................... H01L 21/82341 257/288 |
| 2012/0289040 A1 | 11/2012 | Huang et al. |
| 2013/0181292 A1 | 7/2013 | Sardesai |
| 2014/0004694 A1 | 1/2014 | Hou |

* cited by examiner

SEMICONDUCTOR DEVICE HAVING A METAL GATE

PRIORITY CLAIM

The present application is a divisional of U.S. application Ser. No. 14/303,024, filed Jun. 12, 2014, which is a continuation-in-part of U.S. application Ser. No. 14/189,257, filed Feb. 25, 2014, now U.S. Pat. No. 9,230,962, issued Jan. 5, 2016, which is a divisional of U.S. application Ser. No. 13/247,286, filed Sep. 28, 2011, and issued as U.S. Pat. No. 8,685,808 on Apr. 1, 2014, which are entirely incorporated by reference herein.

FIELD

The disclosure relates to integrated circuit structure and, more particularly, to a semiconductor device having a metal gate.

BACKGROUND

When a semiconductor device, such as a metal-oxide-semiconductor field-effect transistor (MOSFET), is scaled down through various technology nodes, high-k gate dielectric layer and metal gate electrode layer are incorporated into the gate stack of the MOSFET to improve device performance with the decreased feature sizes. The MOSFET processes comprise a "gate last" process to replace an original poly-silicon gate electrode with the metal gate electrode to improve device performance.

However, there are challenges to implement such features and processes in complementary metal-oxide-semiconductor (CMOS) fabrication. As the gate length and spacing between devices decrease, these problems are exacerbated. For example, it is difficult to prevent parasitic capacitance resulted among gate stacks of the MOSFET because of the reduced spacing between the gate stacks, thereby affecting the device performance.

BRIEF DESCRIPTION OF THE DRAWINGS

The present disclosure is best understood from the following detailed description when read with the accompanying figures. It is emphasized that, in accordance with the standard practice in the industry, various features are not drawn to scale and are used for illustration purposes only. In fact, the relative dimensions of the various features may be arbitrarily increased or reduced for clarity of discussion.

DESCRIPTION

Figure 1:
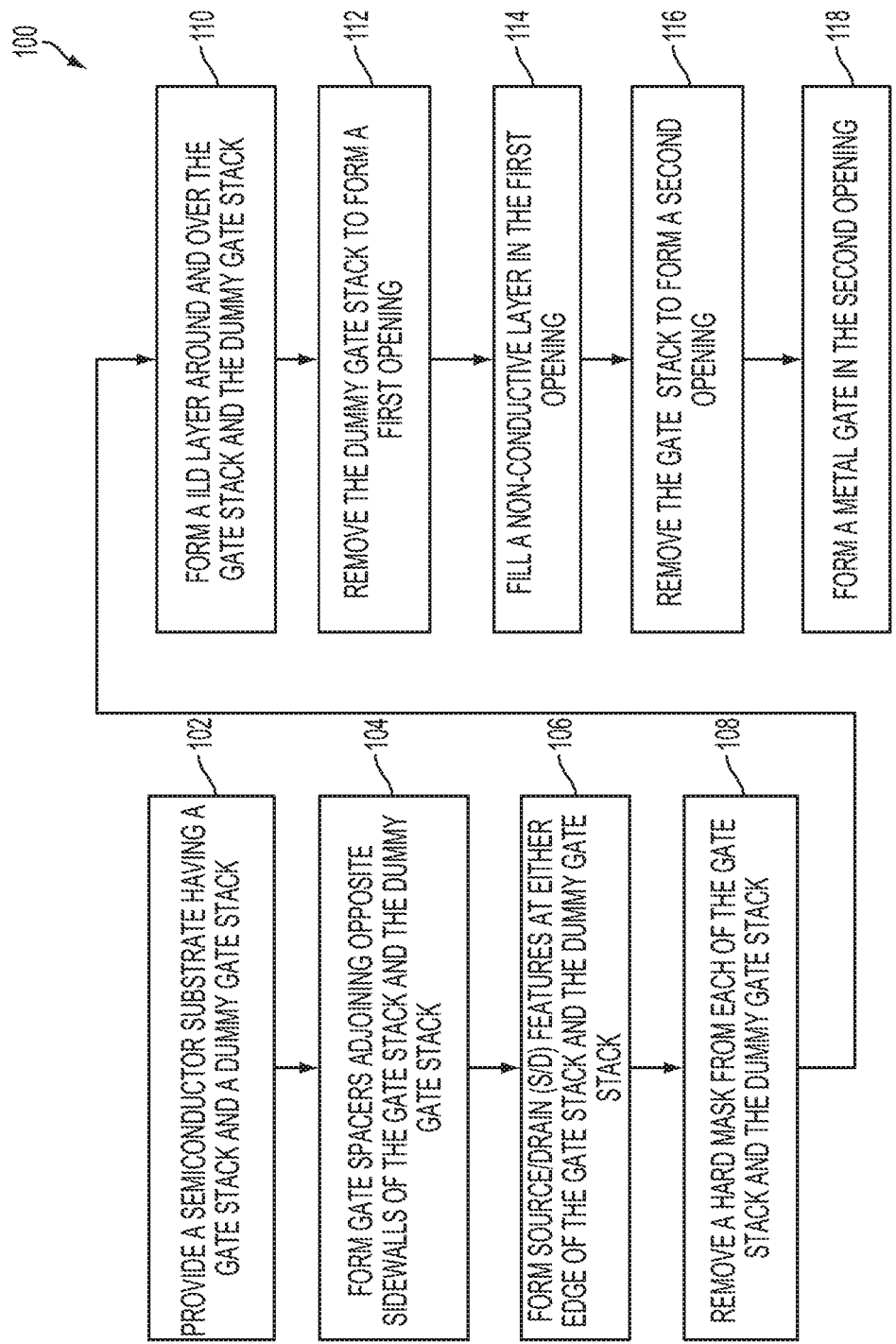
FIG. 1 is a flowchart of a method of fabricating a semiconductor device comprising gate stacks according to various aspects of the present disclosure.

It is understood that the following disclosure provides many different embodiments, or examples, for implementing different features of the disclosure. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

FIG. 1 is a flowchart of a method 100 of fabricating a semiconductor device 200 (FIGS. 2-10) according to various aspects of the present disclosure. FIGS. 2-10 are schematic cross-sectional views of a semiconductor device 200 at various stages of fabrication according to an embodiment of the method 100 of FIG. 1. The semiconductor device 200 may be at least a portion of a microprocessor, memory cell, and/or other integrated circuit (IC). It is noted that the method of FIG. 1 does not produce a completed semiconductor device 200. A completed semiconductor device 200 may be fabricated using complementary metal-oxide-semiconductor (CMOS) technology processing. Accordingly, it is understood that additional processes may be provided before, during, and after the method 100 of FIG. 1, and that some other processes may only be briefly described herein. Also, FIGS. 1 through 10 are simplified for a better understanding of the present disclosure. For example, although the figures illustrate the semiconductor device 200, it is understood the IC may comprise a number of other devices comprising resistors, capacitors, inductors, fuses, etc.

Figure 2:
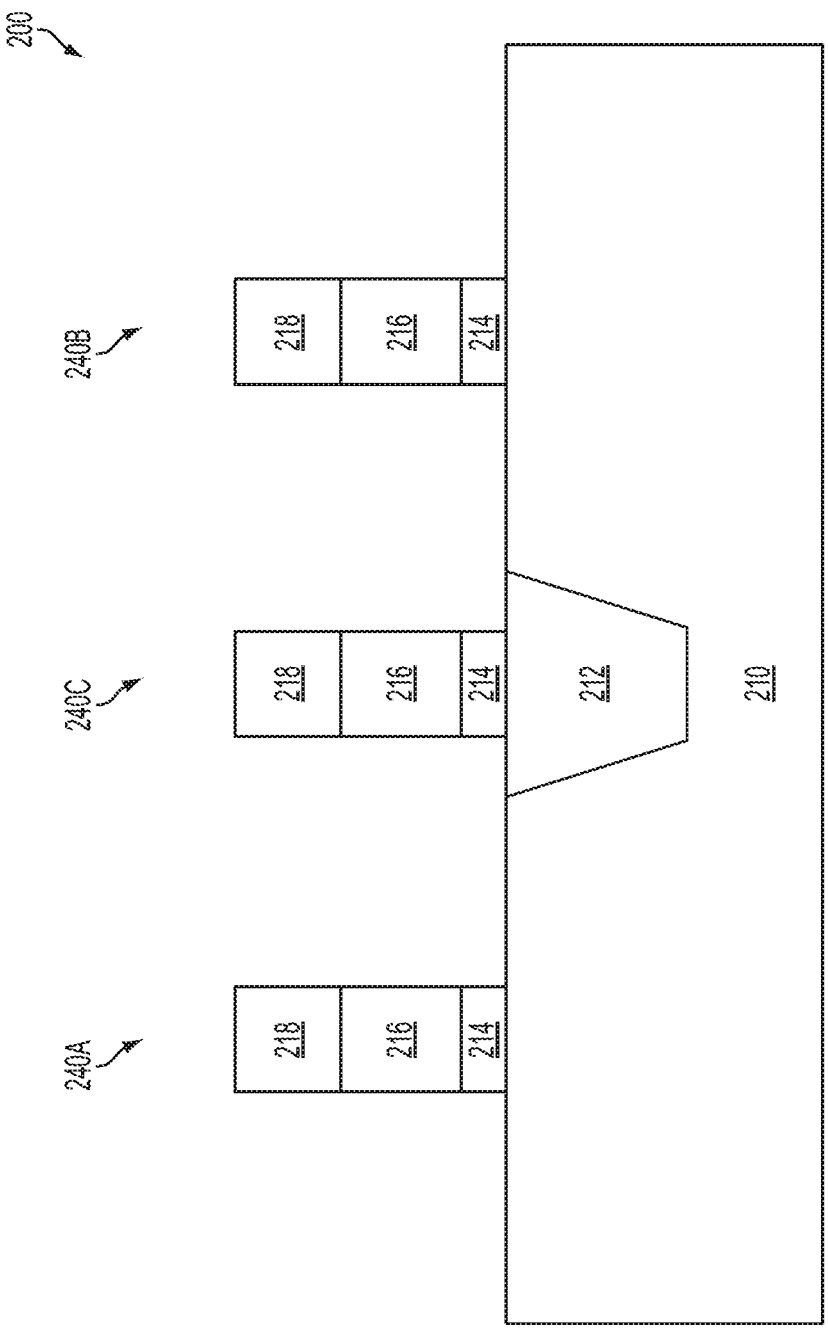
FIGS. 2-10 are schematic cross-sectional views of the gate stacks of a semiconductor device at various stages of fabrication according to various aspects of the present disclosure.

Referring to FIGS. 1 and 2, the method 100 begins at step 102 wherein a substrate 210 is provided. In at least one embodiment, the substrate 210 comprises a crystalline silicon substrate (e.g., wafer). In an alternative embodiment, the substrate 210 may include a silicon-on-insulator (SOI) structure. The substrate 210 may further comprise active regions (not shown). The active regions may include various doping configurations depending on design requirements as known in the art. In some embodiments, the active regions may be doped with p-type or n-type dopants. For example, the active regions may be doped with p-type dopants, such as boron or $BF_2$, to perform the doping; n-type dopants, such as phosphorus or arsenic, to perform the doping; and/or combinations thereof. The active regions may act as regions configured for an N-type metal-oxide-semiconductor transistor device (referred to as an NMOS) and regions configured for a P-type metal-oxide-semiconductor transistor device (referred to as a PMOS).

In some embodiments, an isolation structure 212 is formed in the substrate 210 to isolate the various active regions. The isolation structure 212, for example, is formed using isolation technology, such as local oxidation of silicon (LOCOS) or shallow trench isolation (STI), to define and electrically isolate the various active regions. In the present embodiment, the isolation structure 212 includes a STI. The isolation structure 212 may comprise silicon oxide, silicon nitride, silicon oxynitride, fluoride-doped silicate glass (FSG), a low-K dielectric material, other suitable materials, and/or combinations thereof. The isolation structure 212, and in the present embodiment, the STI, may be formed by any suitable process. As one example, the formation of the STI may include patterning the semiconductor substrate 210 by a photolithography process, etching a trench in the substrate 210 (for example, by using a dry etching, wet etching, and/or plasma etching process), and filling the trench (for example, by using a chemical vapor deposition process) with a dielectric material. In some embodiments, the filled trench may have a multi-layer structure such as a thermal oxide liner layer filled with silicon nitride or silicon oxide.

Still referring to FIG. 2, in at least one embodiment, gate stacks 240A, 240B, and 240C are formed over the surface of the substrate 210. In the present embodiment, the gate stacks 240A, 240B are designed for forming active devices, and the gate stack 240C is a dummy gate stack. In the present embodiment, the dummy gate stack 240C is over the isolation structure 212 and between the gate stacks 240A and 240B. In some embodiments, each of the gate stacks 240A, 240B, and the dummy gate stack 240C comprises, in order, a gate dielectric feature 214, a gate electrode feature 216, and a hard mask feature 218 over the substrate 210. In some embodiments, a gate dielectric layer (not shown), a gate electrode layer (not shown), and a hard mask layer (not shown) are sequentially deposited over the substrate 210. Then, a patterned photo-sensitive layer (not shown) is formed over the hard mask layer. The pattern of the photo-sensitive layer is transferred to the hard mask layer and then transferred to the gate electrode layer and gate dielectric layer to form the gate stacks 240A, 240B, and the dummy gate stack 240C. The photo-sensitive layer is stripped thereafter by a dry and/or wet stripping process.

The gate dielectric feature 214, in one example, is a thin film comprising silicon oxide, silicon nitride, silicon oxynitride, high dielectric constant (high-k) dielectrics, other suitable dielectric materials, or combinations thereof. High-k dielectrics comprise metal oxides. Examples of metal oxides used for high-k dielectrics include oxides of Li, Be, Mg, Ca, Sr, Sc, Y, Zr, Hf, Al, La, Ce, Pr, Nd, Sm, Eu, Gd, Tb, Dy, Ho, Er, Tm, Yb, Lu and/or mixtures thereof. In the present embodiment, the gate dielectric feature 214 comprises a high-k dielectric layer with a thickness in the range of about 10 angstroms to about 30 angstroms. The gate dielectric feature 214 may be formed using a suitable process such as atomic layer deposition (ALD), chemical vapor deposition (CVD), physical vapor deposition (PVD), thermal oxidation, UV-ozone oxidation, or combinations thereof. An interfacial layer (not shown) may further be included under the gate dielectric feature 214 to reduce the risk of damage between the gate dielectric feature 214 and the substrate 210. The interfacial layer may comprise silicon oxide.

In some embodiments, the gate electrode feature 216 over the gate dielectric feature 214 comprises a single layer or multilayer structure. In the present embodiment, the gate electrode feature 216 may comprise poly-silicon. Further, the gate electrode feature 216 may be doped poly-silicon with the same or different doping species. In at least one embodiment, the gate electrode feature 216 has a thickness in the range of about 30 nm to about 60 nm. The gate electrode feature 216 may be formed using a process such as low-pressure chemical vapor deposition (LPCVD), plasma enhanced chemical vapor deposition (PECVD), other suitable processes, or combinations thereof. In at least one embodiment, silane ($SiH_4$) is used as a chemical gas in the CVD process to form the gate electrode feature 216. In other embodiments, the gate electrode feature 216 and/or the gate dielectric feature 214 may be sacrificial layers and will be removed by a replacement step in the subsequent processes.

In some embodiments, the hard mask feature 218 over the gate electrode feature 216 comprises silicon oxide. In some alternative embodiments, the hard mask feature 218 may comprise silicon nitride, silicon oxynitride, and/or other suitable dielectric materials, and may be formed using a method such as CVD or PVD. In some embodiments, the hard mask feature 218 has a thickness in the range from about 100 angstroms to about 800 angstroms.

Figure 3:
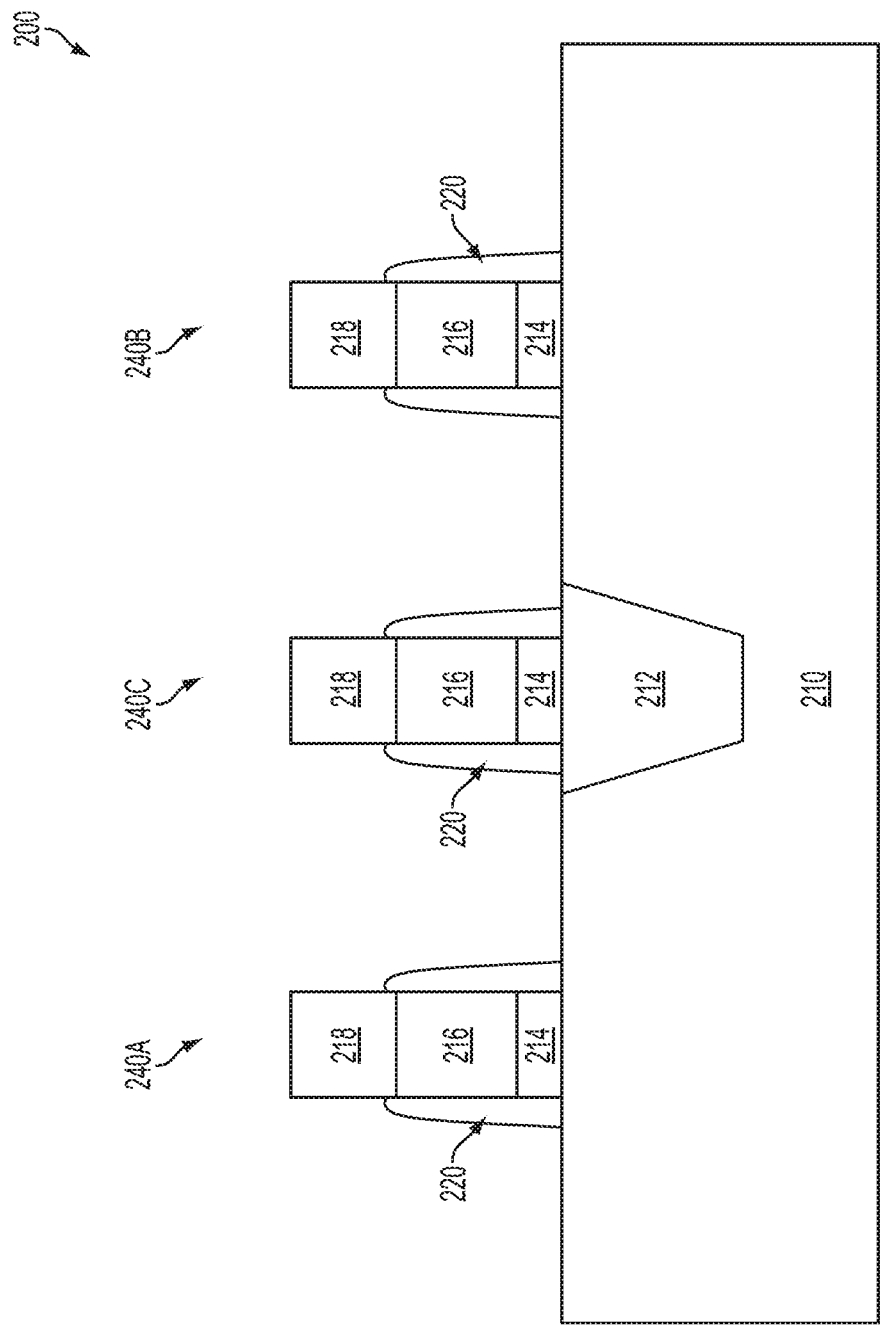

Referring to FIGS. 1 and 3, the method 100 proceeds to step 104 wherein gate spacers 220 are formed adjoining opposite sidewalls of the gate stacks 240A, 240B, and the dummy gate stack 240C. In some embodiments, the gate spacers 220 may include a single-layer or a multiple-layer structure. In the present embodiment, a blanket layer of spacer material (not shown) is formed around and over the gate stacks 240A, 240B, and the dummy gate stack 240C by a depositing process including CVD, PVD, ALD, or other suitable techniques. In some embodiments, the spacer material comprises silicon oxide, silicon nitride, silicon oxynitride, other suitable material, or combinations thereof. In some embodiments, the spacer material has a thickness ranging from about 5 nm to about 15 nm. Then, an anisotropic etching process is performed on the spacer material to form the gate spacers 220. In some embodiments, the gate spacers 220 have a height less than the height of the gate stacks 240A, 240B, and the dummy gate stack 240C. In at least one embodiment, the gate spacers 220 are adjoining sidewalls of the gate dielectric feature 214 and the gate electrode feature 216, but expose sidewalls of the hard mask feature 218.

Figure 4:
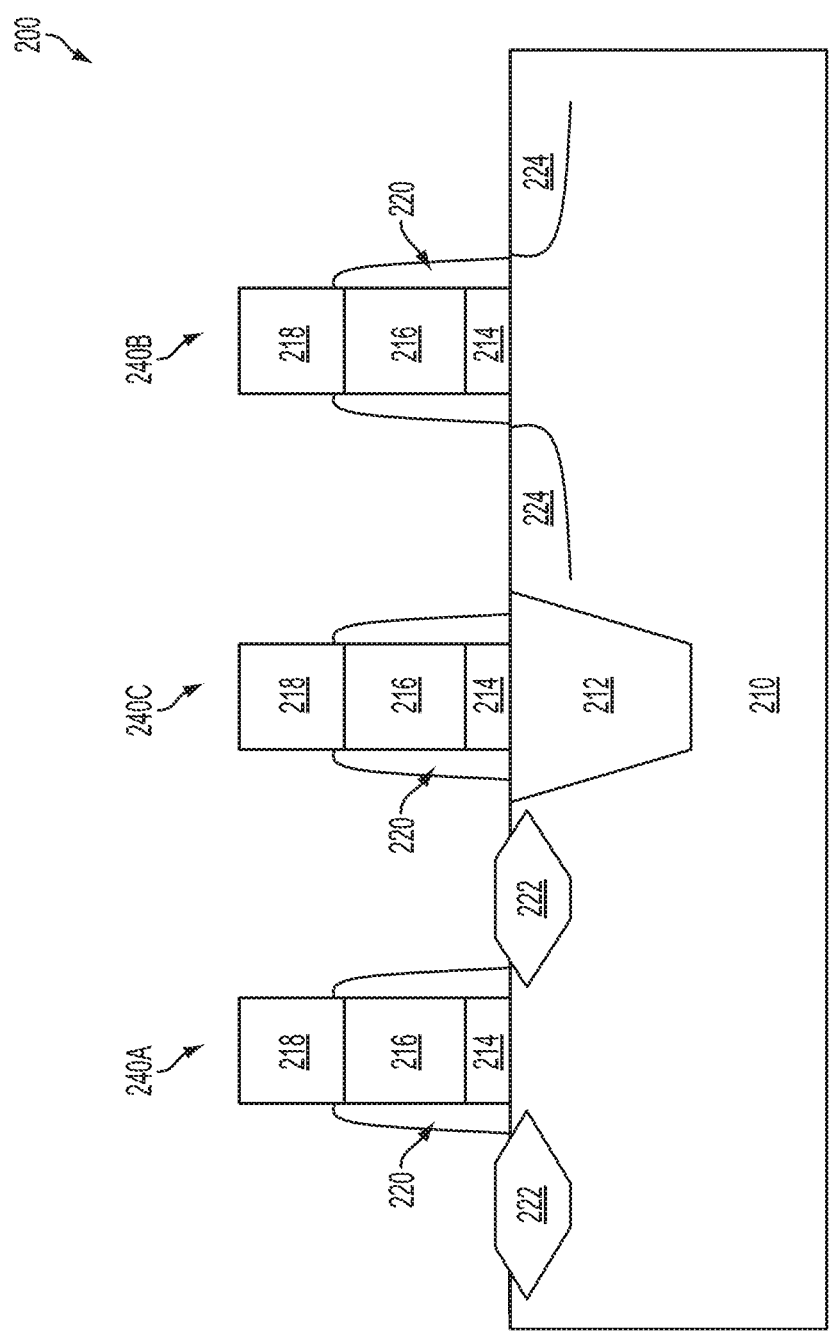

Referring to FIGS. 1 and 4, the method 100 continues with step 106 in which source/drain (S/D) features 222, 224 are formed in the substrate 210. In at least one embodiment, the source/drain (S/D) features 222 and the gate stack 240A are configured for forming a PMOS device, and the source/drain (S/D) features 224 and the gate stack 240B are configured for forming an NMOS device. The formation processes of the S/D features 222 may start from forming recess cavities (not shown) at either side of the gate stack 240A in the substrate 210. In the present embodiment, the recess cavities are formed using an isotropic dry etching process and then followed by an anisotropic wet or dry etching process. In some embodiments, a strained material is grown and filled in the recess cavities to form the S/D features 222. In some embodiments, the growth process of the strained material comprises selective epitaxy growth (SEG), cyclic deposition and etching (CDE), chemical vapor deposition (CVD) techniques (e.g., vapor-phase epitaxy (VPE) and/or ultra-high vacuum CVD (UHV-CVD)), molecular beam epitaxy (MBE), other suitable epi processes, or combinations thereof. In some embodiments, the strained material is silicon germanium (SiGe). In some embodiments, the strained material is epi SiGe with p-type dopants, such as boron.

In at least one embodiment, the S/D features 224 are formed at either side of the gate stack 240B in the substrate 210 by one or more ion implantation processes. The implantation, for example, is performed using n-type dopants, such as phosphorus or arsenic, under predetermined implantation energy and title angle to meet the requirements of device performance. In an alternative embodiment, the S/D features 224 include epi silicon (Si) with n-type dopants. Processes for forming the epi Si may include some etching processes for forming recess cavities (not shown) in the substrate 210 and then filling the recess cavities with the epi Si. The growth process of the epi Si comprises SEG, CDE, CVD techniques, MBE, other suitable epi processes, or combinations thereof.

Figure 5:
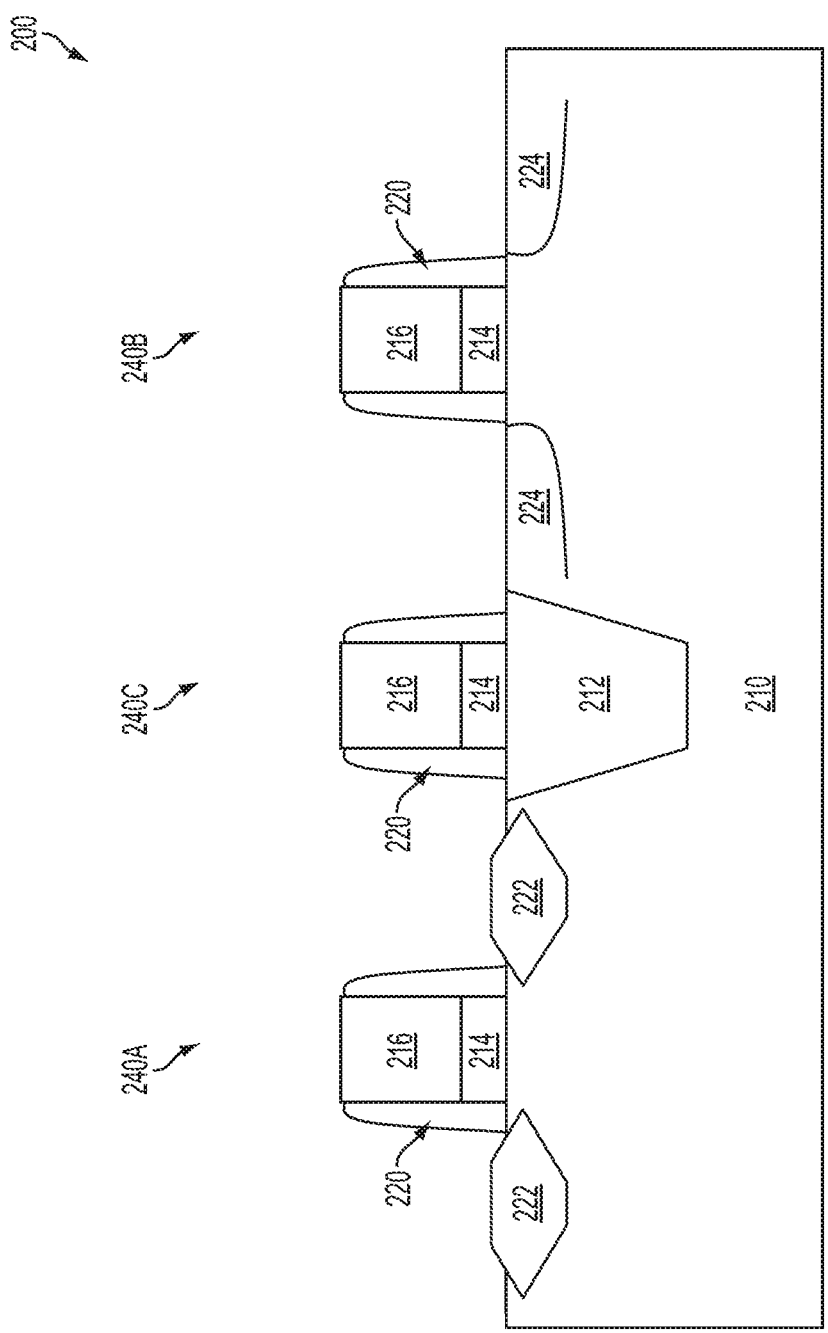

Referring to FIGS. 1 and 5, the method 100 continues with step 108 in which the hard mask feature 218 is removed from the gate stacks 240A, 240B, and the dummy gate stack 240C by an etching process. The etching process, for example, is a dry etching process using $NF_3$ gas and/or argon gas, with flow rates ranging from about 10 sccm to about 100 sccm and from about 10 sccm to about 200 sccm, respectively. In some embodiments, the etching process is performed with an RF bias ranging between about 60 V and about 200V, under a vacuum pressure ranging from about 10 mTorr to about 100 mTorr. The step of removing the hard mask feature 218 may reduce the heights of the gate stacks 240A, 240B, and the dummy gate stack 240C, therefore, reducing the aspect ratio of the gaps between the gate stacks 240A, 240B, and the dummy gate stack 240C. The reduced aspect ratio is helpful for a subsequent gap filling process.

Figure 6:
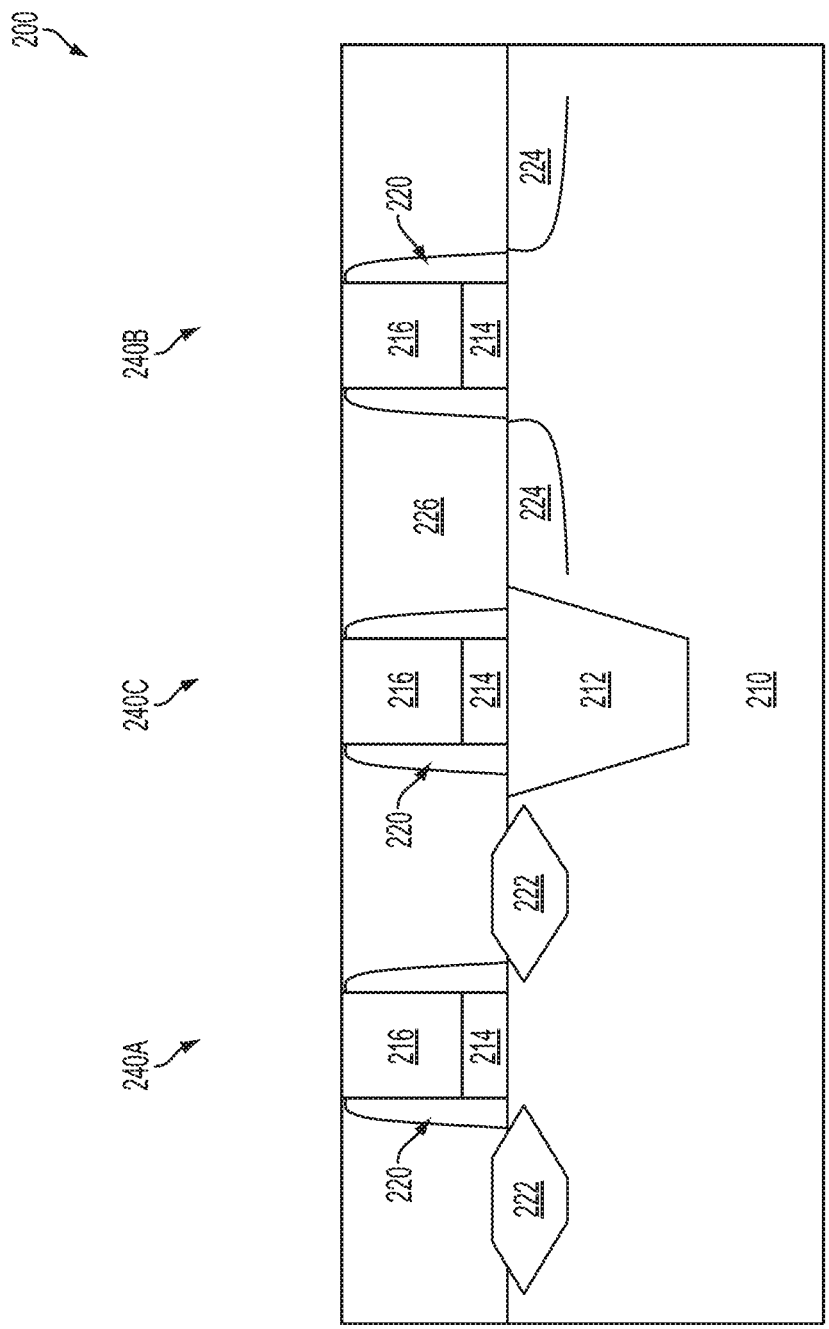

Referring to FIGS. 1 and 6, the method 100 continues with step 110 in which an interlayer dielectric (ILD) 226 is filled among the gate stacks 240A, 240B and the dummy gate stack 240C. The ILD 226 may include materials such as oxide, nitride, oxynitride, low dielectric constant (low-k) dielectric material, ultra low-k dielectric material, extreme low-k dielectric material, other dielectric material, and/or combinations thereof. In some embodiments, the ILD 226 is formed by depositing an ILD layer (not shown) around and over the gate stacks 240A, 240B and the dummy gate stack 240C, then, applying a planarization process to remove the portion of ILD layer over the gate stacks 240A, 240B and the dummy gate stack 240C. In some embodiment, the step of depositing the ILD layer comprises a CVD process, a HDP CVD process, a HARP, a spin-coating process, other deposition process, and/or any combinations thereof. In some embodiment, the planarization process includes a chemical-mechanical polish (CMP) process, a dry etch process, a wet etch process, and/or combinations thereof. The planarization process may form the ILD 226 with a top surface substantially co-planar with the top surface of the gate stacks 240A, 240B and the dummy gate stack 240C.

Figure 7:
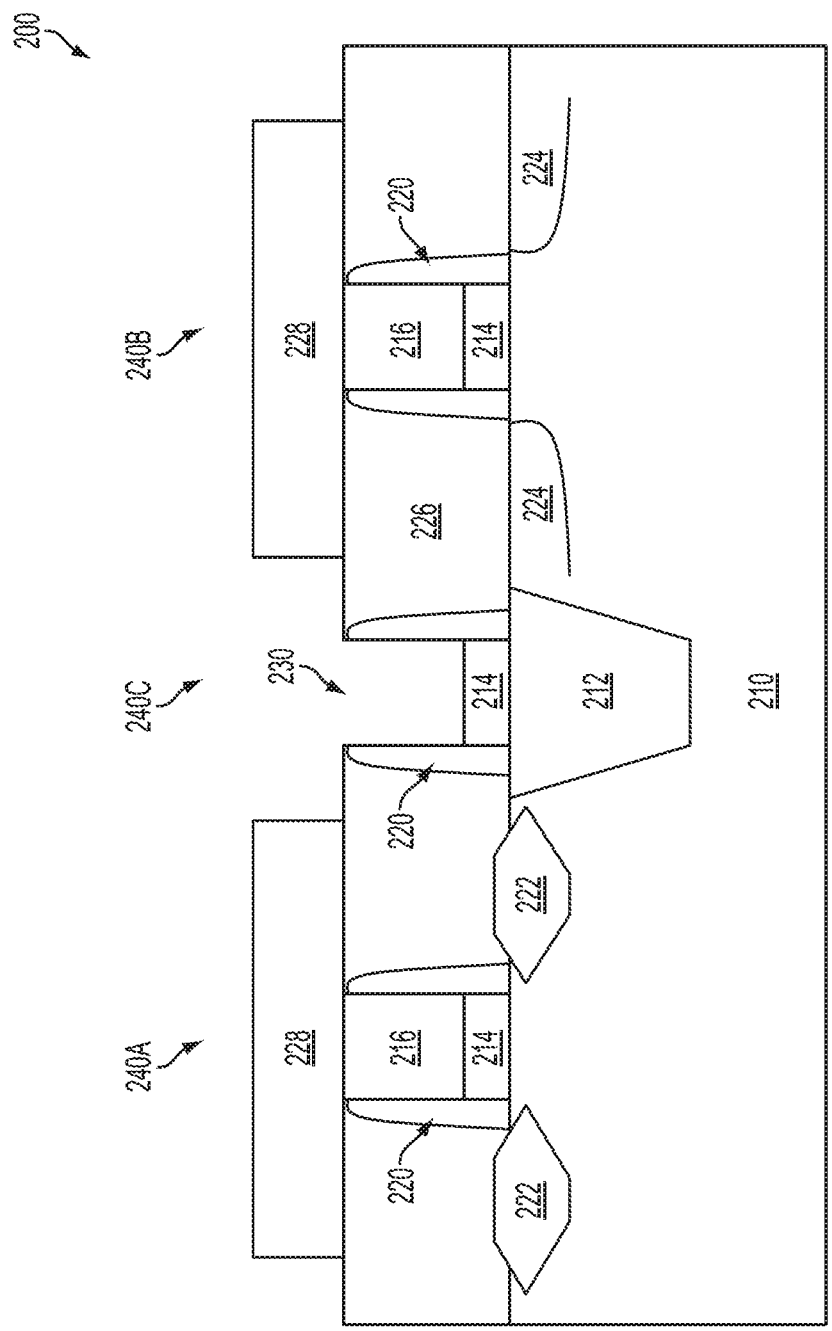

Referring to FIGS. 1 and 7, the method 100 continues with step 112 in which a removing process is provided to remove at least a portion of the dummy gate stack 240C, thereafter, an opening 230 is formed. The gate stacks 240A, 240B are not removed by the removing process because of being covered by protectors 228, e.g., photoresist patterns. In at least one embodiment, the removing process removes the gate electrode feature 216 of the dummy gate stack 240C but leaves the gate dielectric feature 214 of the dummy gate stack 240C. In an alternative embodiment, the removing process removes the gate electrode feature 216 and the gate dielectric 214 feature of the dummy gate stack 240C. The removing process can include a dry etch process and/or a wet etch process. In some embodiments, the removing process is a two-step dry etching process comprising a first step to break through (remove) a native oxide (not shown) over the gate electrode feature 216 and a second step to remove the gate electrode feature 216 (e.g., poly-silicon). In some embodiments, the first step of the etching process is performed using NF3 gas and/or argon gas, with flow rates ranging from about 10 sccm to about 100 sccm and from about 10 sccm to about 200 sccm, respectively. In some embodiments, the first step of the etching process is performed with an RF bias ranging between about 60 V and about 200V, under a vacuum pressure ranging from about 10 mTorr to about 100 mTorr. The second step of the etching process is performed, for example, using Cl gas, HBr gas, He gas, or combinations thereof. In the present embodiment, the flow rates of Cl gas, HBr gas, and He ranges from about 10 sccm to about 100 sccm, from about 200 sccm to about 400 sccm, and from about 100 sccm to about 300 sccm, respectively. In some embodiments, the second step of the etching process is performed with an RF bias ranging between about 60 V and about 200V. In some embodiments, the second step of the etching process is performed with an RF bias less than the RF bias for performing the first step of the etching process. In some embodiments, the second step of the etching process is performed under a vacuum pressure ranging from about 10 mTorr to about 100 mTorr. The protectors 228 are then removed using a stripping process after the removing process.

Figure 8:
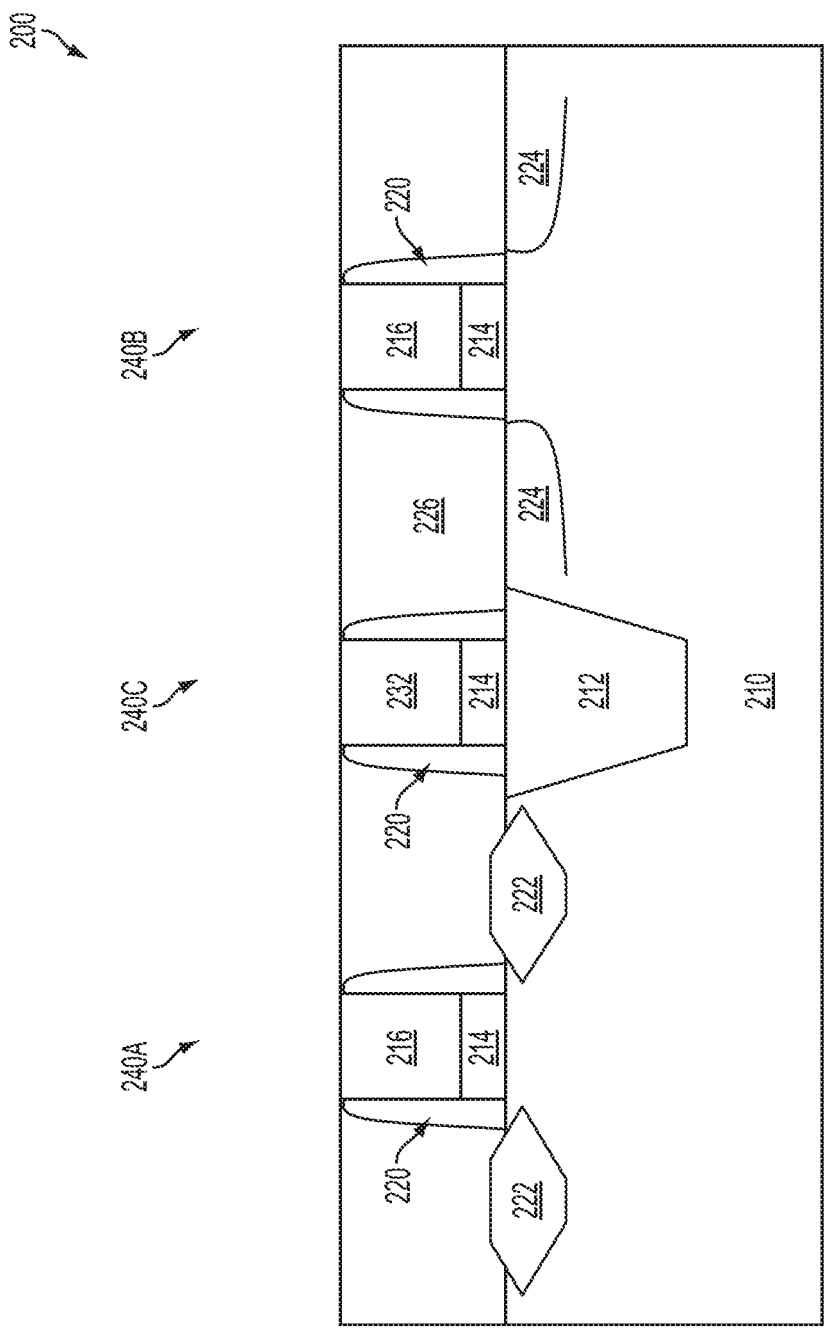

Referring to FIGS. 1 and 8, the method 100 continues with step 114 in which a non-conductive layer (not shown) is filled within and above the opening 230, and over the ILD 226. In the present embodiment, the non-conductive layer is dielectric including materials such as oxide, nitride, oxynitride, low-k dielectric material, ultra low-k dielectric material, extreme low-k dielectric material, other dielectric material, and/or combinations thereof. The non-conductive layer may be formed by, for example, a CVD process, a high-density plasma (HDP) CVD process, a high-aspect-ratio process (HARP), a spin-coating process, other deposition process, and/or any combinations thereof. Then, a planarizing process can be applied to remove the portion of the non-conductive layer above the opening 230 and over the ILD 226, thereby forming the non-conductive gate 232 having a top surface substantially co-planar with the top surface of the gate stacks 240A, 240B, or the ILD 226. The planarizing process can include a chemical-mechanical polish (CMP) process, a dry etch process, a wet etch process, and/or combinations thereof. In some embodiments, the non-conductive gate 232 has a material different from the material of the ILD 226, whereby there is a removing selectivity for the planarizing process.

Figure 9:
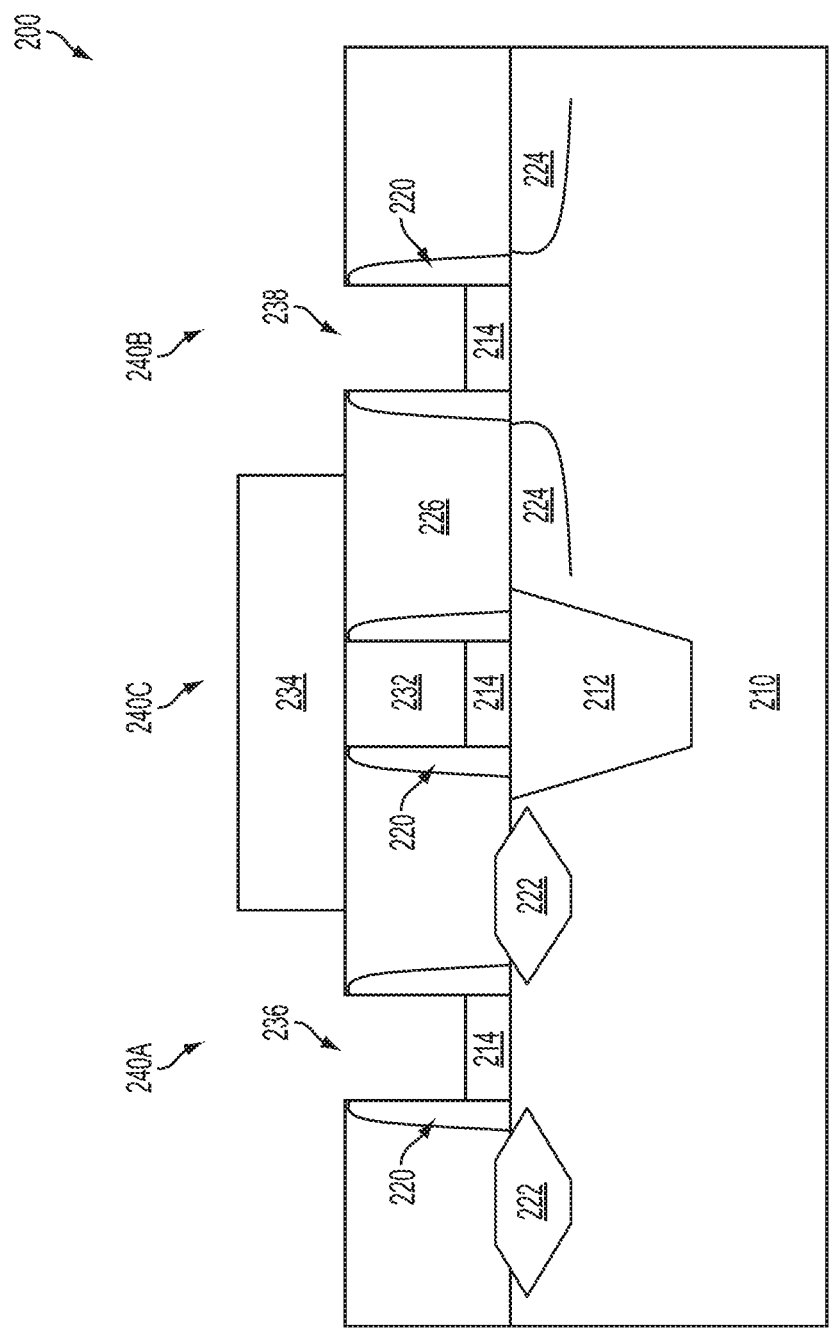

Referring to FIGS. 1 and 9, the method 100 continues with step 116 in which a removing process is provided to remove at least the gate electrode feature 216 of the gate stacks 240A, 240B to form openings 236, 238, respectively. The non-conductive gate 232 is not removed in the removing process by providing a protector 234, e.g., a photoresist pattern, thereon. In an embodiment, the removing process removes the gate electrode feature 216 of the gate stacks 240A, 240B but leaves the gate dielectric feature 214 of the gate stacks 240A, 240B if the gate dielectric feature 214 comprising a high-k dielectric material. In an alternative embodiment, the removing process removes the gate electrode feature 216 and the gate dielectric feature 214 of the gate stacks 240A, 240B if the gate dielectric feature 214 is not composed of a high-k dielectric material. The removing process can include a dry etch process and/or a wet etch process. In some embodiments, the removing process is a two-step dry etching process comprising a first step to break through a native oxide (not shown) over the gate electrode feature 216 and a second step to remove the gate electrode feature 216 (e.g., poly-silicon). In some embodiments, the first step of the etching process is performed using $NF_3$ gas and argon gas, with flow rates ranging from about 10 sccm to about 100 sccm and from about 10 sccm to about 200 sccm, respectively. In some embodiments, the two-step etching process is performed with the chemicals and conditions as mentioned above. The protector 234 is thereafter removed by a stripping process Referring to FIGS. 1 and 10, the method 100 continues with step 118 in which metal gates 240, 242 are formed in the openings 236, 238, respectively. The metal gates 240, 242 are formed to replace the gate electrode feature 216 (i.e., poly-silicon gate layer) of the gate stacks 240A, 240B. As mentioned above, the gate stack 240A is designed for PMOS device and the gate stack 240B is designed for NMOS device. The metal gate 240 has a first work function for PMOS device and the metal gate 242 has a second work function for NMOS device. In some embodiments, the metal gates 240, 242 comprise any suitable material including aluminum, copper, tungsten, titanium, tantalum, tantalum aluminum, tantalum aluminum nitride, titanium nitride, tantalum nitride, nickel silicide, cobalt silicide, silver, TaC, TaSiN, TaCN, TiAl, TiAlN, WN, metal alloys, other suitable materials, and/or combinations thereof.

Subsequent processing may form various contacts/vias/lines and multilayer interconnect features (e.g., metal layers and interlayer dielectrics) over the substrate, which are configured to connect the various features or structures of the semiconductor device. The additional features may provide electrical interconnection to the device. For example, a multilayer interconnection includes vertical interconnects, such as conventional vias or contacts, and horizontal interconnects, such as metal lines. The various interconnection features may implement various conductive materials including copper, tungsten, and/or silicide. In one example, a damascene and/or dual damascene process is used to form a copper related multilayer interconnection structure.

Figure 11:
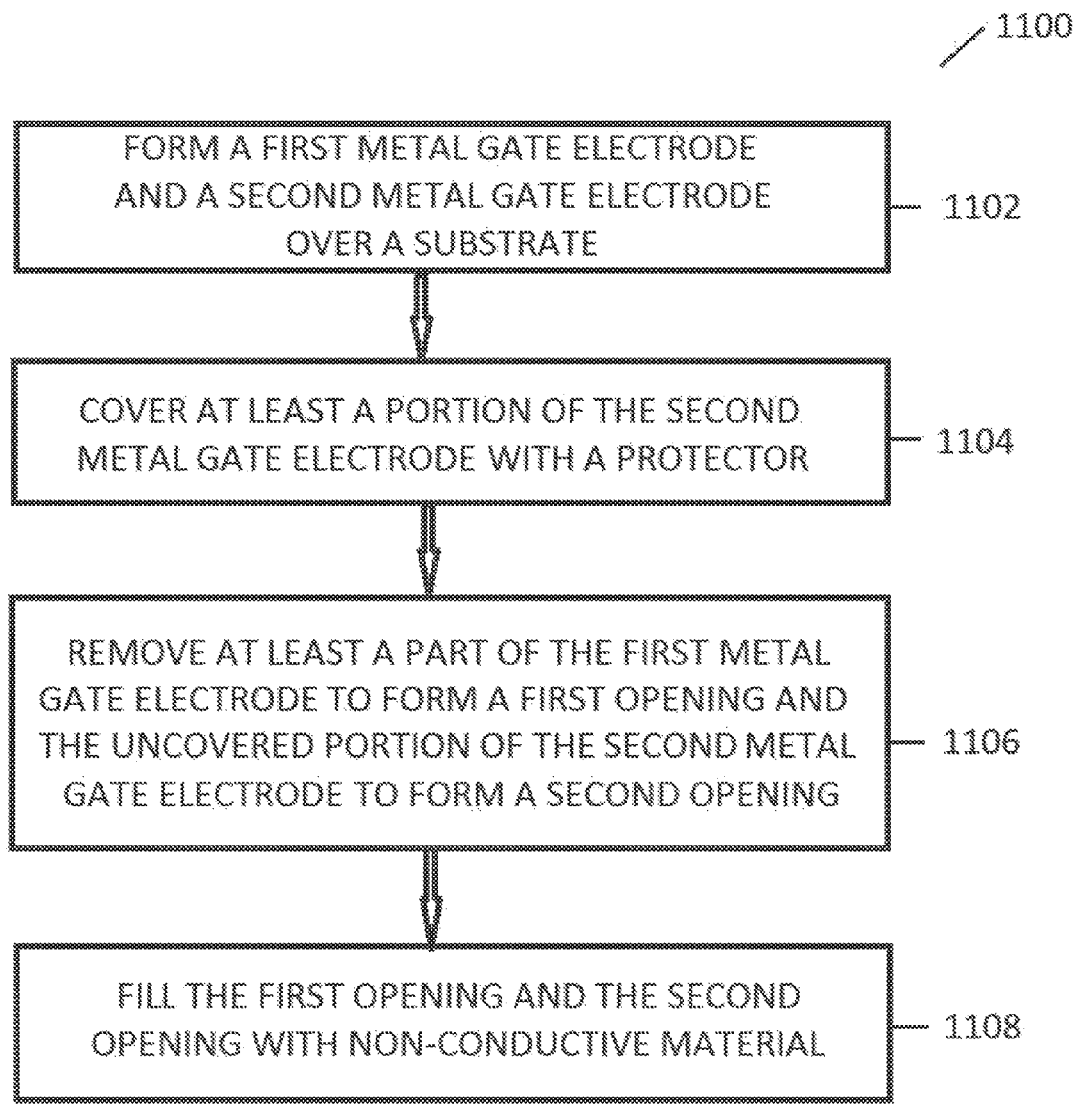
FIG. 11 is a flowchart of a method of fabricating a semiconductor device according to some embodiments.

FIG. 11 is a flowchart of a method 1100 of fabricating a semiconductor device according to some embodiments. In some embodiments, a semiconductor device fabricated in accordance with method 1100 is at least a portion of a microprocessor, memory cell, and/or another integrated circuit (IC) device. In some embodiments, method 1100 does not produce a completed semiconductor device. In some embodiments, a completed semiconductor device is fabricated using complementary metal-oxide-semiconductor (CMOS) technology processing. In some embodiments, additional processes are provided before, during, or after method 1100 of FIG. 11.

FIGS. 12A through 15D are views of semiconductor devices at various stages of production, in some embodiments. FIGS. 12A through 15D are simplified to facilitate understanding of the present disclosure. For example, although some figures include a semiconductor device 1200, in some embodiments a complete IC comprises a number of other devices including resistors, capacitors, inductors, fuses, etc.

Method 1100 begins with operation 1102, which includes forming a first metal gate electrode and a second metal gate electrode over a substrate. In some embodiments, the first metal gate electrode is one metal gate electrode of a plurality of first metal gate electrodes. In some embodiments, the second metal gate electrode is one metal gate electrode of a plurality of second metal gate electrodes. In some embodiments, the first metal gate electrode is formed by a deposition process such as chemical vapor deposition (CVD), physical vapor deposition (PVD), or atomic layer deposition (ALD). In some embodiments, the second metal gate electrode is formed by a deposition process such as chemical vapor deposition (CVD), physical vapor deposition (PVD), or atomic layer deposition (ALD). In some embodiments, the first metal gate electrode and the second metal gate electrode are formed by a same deposition process. In some embodiments, the first metal gate electrode and the second metal gate electrode are formed by different deposition processes.

In some embodiments, the first metal gate electrode and/or the second metal gate electrode is/are similar to metal gate 240 or metal gate 242 of semiconductor device 200 (FIG. 10) formed in accordance with method 100 (FIG. 1).

In some embodiments, the first metal gate electrode and/or the second gate electrode include any suitable material including aluminum, copper, tungsten, titanium, tantalum, tantalum aluminum, tantalum aluminum nitride, titanium nitride, tantalum nitride, nickel silicide, cobalt silicide, silver, TaC, TaSiN, TaCN, TiAl, TiAlN, WN, metal alloys, other suitable materials, and/or combinations thereof.

In some embodiments, the first metal gate electrode and/or the second metal gate electrode includes a first work function layer. The first work function layer is configured to adjust a work function value of the first metal gate electrode and/or the second metal gate electrode. In some embodiments, the first work function layer is an n-type work function metallic layer. In some embodiments, the first metal gate electrode and/or the second metal gate electrode includes a second work function layer over the first work function layer. In some embodiments, the second work function layer is a p-type work function layer. In some embodiments, the first and the second work function layers form a combined work function layer to adjust a work function value of a first metal gate electrode and/or second metal gate electrode.

In some embodiments, the first work function layer includes materials such as metal, metal carbide, metal nitride, or other suitable materials. In some embodiments, the first work function layer includes materials such as hafnium, zirconium, titanium, tantalum, aluminum, metal carbides, other suitable materials, or the combinations thereof. In some embodiments, the first work function layer includes TiAl. In some embodiments, the first work function layer is capable of providing a work function value of about 4.3 eV or less.

In some embodiments, the second work function layer includes materials such as metal, metal carbide, metal nitride, or other suitable materials. In some embodiments, the second work function layer includes a conductive metal, such as ruthenium, palladium, platinum, cobalt, nickel, conductive metal oxides, e.g., ruthenium oxide, other suitable materials, or combinations thereof. In some embodiments, the second work function layer includes TiN. In some embodiments, the second work function layer is capable of providing a work function value of about 5 eV or more.

In some embodiments, the substrate is a semiconductor substrate comprising silicon. In some embodiments, the substrate comprises an elementary semiconductor including silicon and/or germanium in crystal; a compound semiconductor including silicon carbide, gallium arsenide, gallium phosphide, indium phosphide, indium arsenide, and/or indium antimonide; an alloy semiconductor including SiGe, GaAsP, AlInAs, AlGaAs, GaInAs, GaInP, and/or GaInAsP; or combinations thereof. In some embodiments, an alloy semiconductor substrate has a gradient SiGe feature in which the Si and Ge composition change from one ratio at one location to another ratio at another location of the gradient SiGe feature. In some embodiments, the alloy SiGe is formed over a silicon substrate. In some embodiments, a SiGe substrate is strained. In some embodiments, the substrate is a semiconductor on insulator (SOI). In some embodiments, the substrate includes a doped epitaxial layer. In some embodiments, the substrate comprises a silicon substrate including a multilayer compound semiconductor structure. In some embodiments, the substrate is similar to substrate 210 of semiconductor device 200 (FIG. 10) formed in accordance with method 100 (FIG. 1).

In some embodiments, the substrate includes various active regions depending on design requirements (e.g., p-type wells or n-type wells). In some embodiments active regions are doped with p-type dopants, such as boron or BF2; n-type dopants, such as phosphorus or arsenic; or a combination thereof. In some embodiments, active regions are formed directly in the substrate, in a P-well structure, in an N-well structure, in a dual-well structure, or using a raised structure. In some embodiments, a semiconductor device fabricated in accordance with method 1100 includes a PFET device and/or a NFET device, and the substrate includes various active regions configured for the PFET device and/or the NFET device.

In some embodiments, an active region includes a source/drain (S/D) region. In some embodiments, the S/D region is an n-type S/D region comprising dopants such as Arsenic (As), Phosphorus (P), other group V element, or the combinations thereof. In some embodiments, the S/D region is formed by performing one or more implantation processes to the substrate, or epitaxially filling features in the substrate. In some embodiments, the S/D region includes epitaxially grown silicon (epi Si) features. In some embodiments, an epi Si S/D feature is in-situ doped or undoped during the epi process. In some embodiments, an epi Si S/D feature is doped with phosphorous to form an Si:P S/D feature or doped with carbon to form an Si:C S/D feature. In some embodiments, a S/D region is a p-type S/D region comprising dopants such as Boron (B) or other group III elements. In some embodiments, a S/D region includes a silicon germanium (SiGe) S/D feature formed by an epi process. In some embodiments, a SiGe S/D feature is in-situ doped or undoped during the epi process.

In some embodiments, an isolation structure is formed in the substrate to isolate the various active regions. In some embodiments, the isolation structure is formed using isolation technology, such as local oxidation of silicon (LOCOS) or shallow trench isolation (STI), to define and electrically isolate the various active regions. In some embodiments, the isolation structure comprises silicon oxide, silicon nitride, silicon oxynitride, fluoride-doped silicate glass (FSG), a low-K dielectric material, other suitable materials, and/or combinations thereof. In some embodiments, the isolation structure is formed by any suitable process. In some embodiments, the isolation structure is an STI formed by patterning the substrate by a photolithography process, etching a trench in the substrate (for example, by using a dry etching, wet etching, and/or plasma etching process), and filling the trench (for example, by using a chemical vapor deposition process) with a dielectric material. In some embodiments, the filled trench has a multi-layer structure such as a thermal oxide liner layer filled with silicon nitride or silicon oxide. In some embodiments, the isolation structure is similar to STI 212 of semiconductor device 200 (FIG. 10) formed in accordance with method 100 (FIG. 1).

In some embodiments, the first metal gate electrode is formed over an active region. In some embodiments, the first metal gate electrode is formed over an isolation feature. In some embodiments, a portion of the first metal gate electrode is formed over an active region and a portion of the first metal gate electrode is formed over an isolation feature. In some embodiments, at least a portion of the first metal gate electrode is formed over a junction in an active region at which two S/D regions abut. In some embodiments, at least a portion of the first metal gate electrode is formed over a junction in an active region at which two drain features abut. In some embodiments, at least a portion of the first metal gate electrode is formed over a junction in an active region at which two source features abut.

In some embodiments, the second metal gate electrode is formed over an active region. In some embodiments, the second metal gate electrode is formed over an isolation feature. In some embodiments, a portion of the second metal gate electrode is formed over an active region and a portion of the second metal gate electrode is formed over an isolation feature.

Figure 12A:
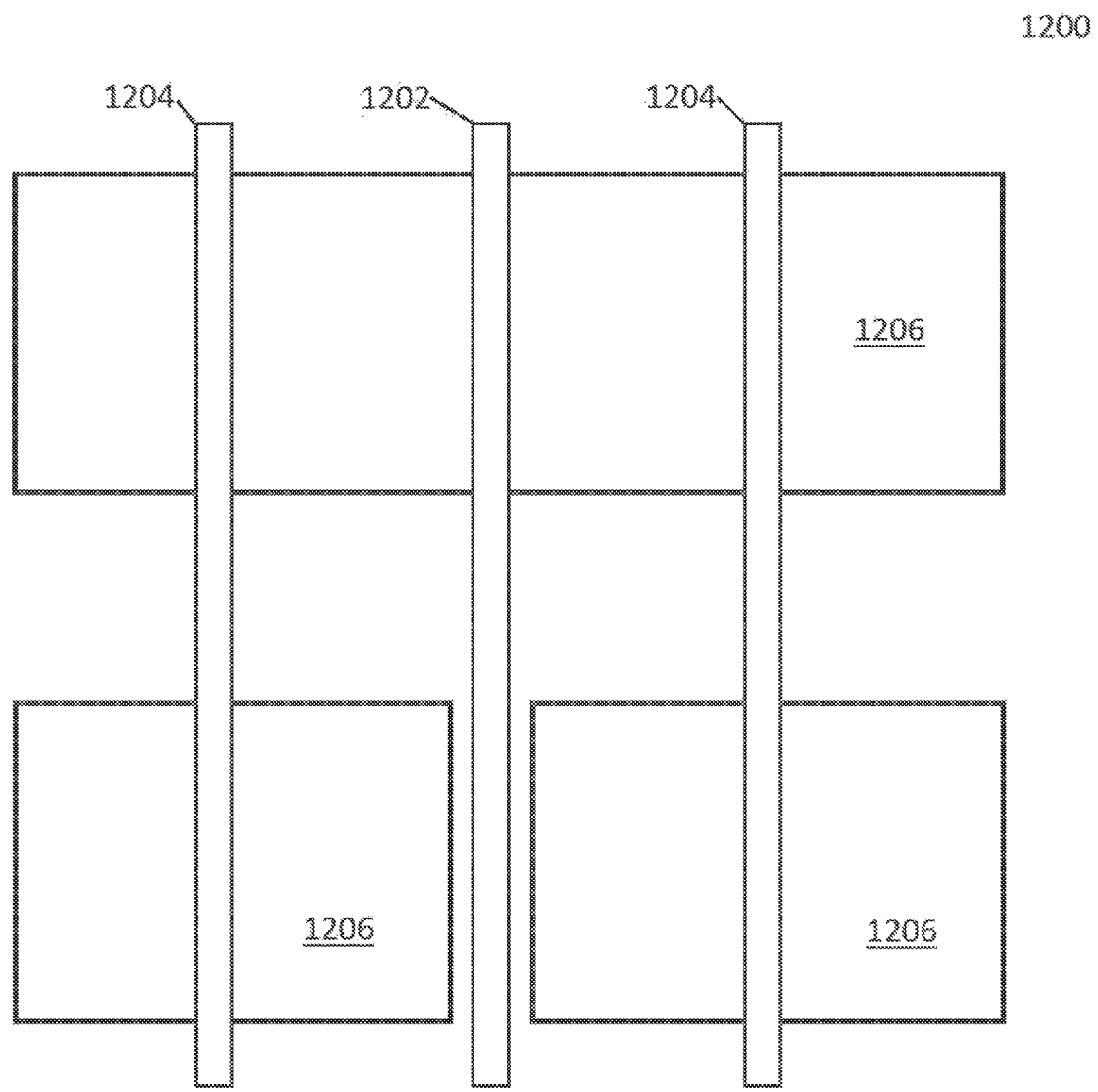
FIGS. 12A-12D are schematic top views of metal gate electrodes of a semiconductor device according to some embodiments.

FIG. 12A is a schematic top view of a semiconductor device 1200 in accordance with operation 1102 of method 1100 in some embodiments. Semiconductor device 1200 includes a first metal gate electrode 1202 between two second metal gate electrodes 1204, and active regions 1206 defined in a substrate. Portions of each of first metal gate electrode 1202 and second metal gate electrodes 1204 are over at least one active region 1206. Portions of each of second metal gate electrodes 1204 are over multiple active regions 1206.

Figure 13A:
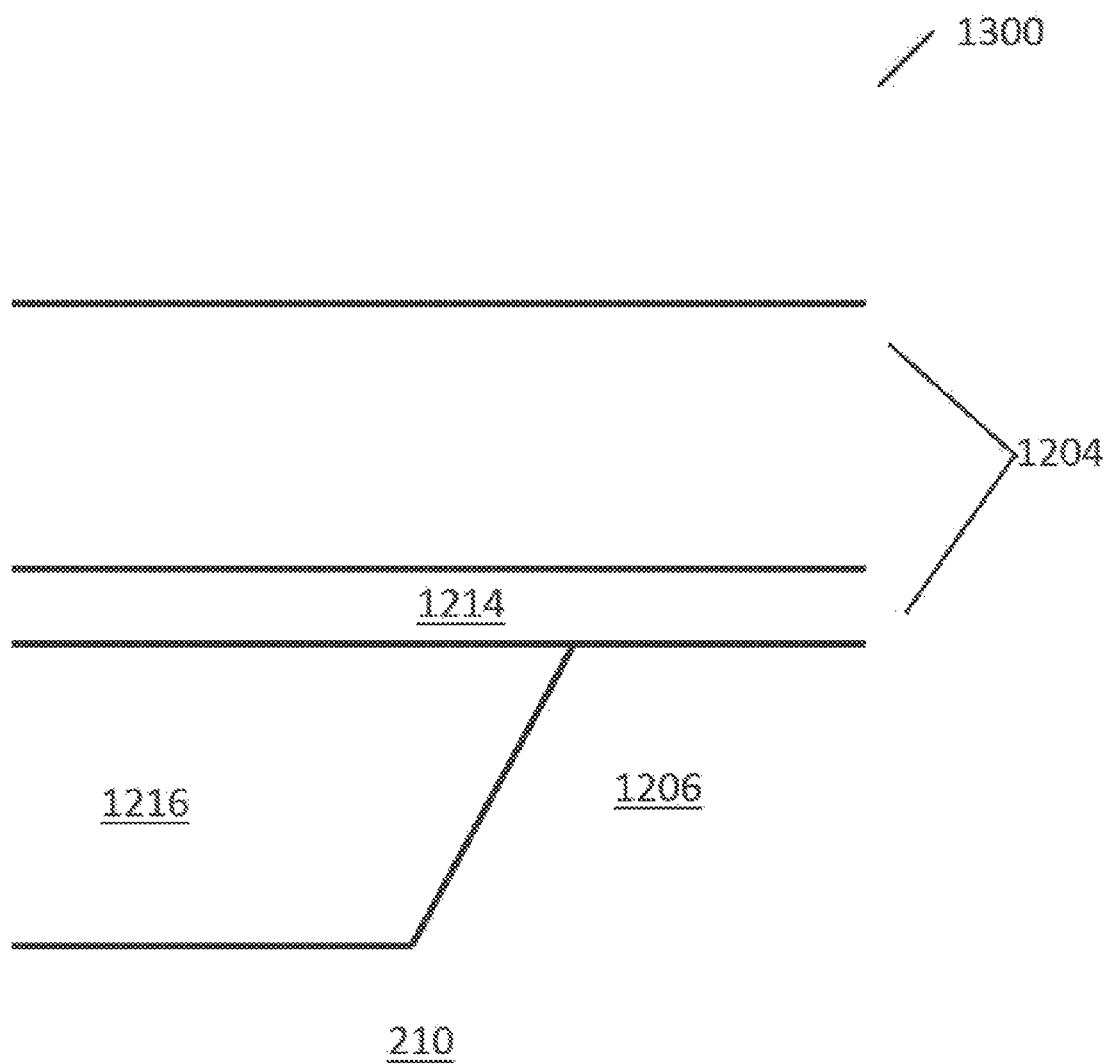
FIGS. 13A-13D are schematic cross-sectional views of metal gate electrodes of a semiconductor device at various stages of fabrication according to some embodiments.

FIG. 13A is a schematic side view of a portion 1300 of semiconductor device 1200 in accordance with operation 1102 of method 1100 in some embodiments. Second metal gate electrode 1204 comprises a work function layer 1214 and is over substrate 210. A portion of second metal gate electrode 1204 is over active region 1206 and a portion of second metal gate electrode 1204 is over an isolation feature 1216 in substrate 210.

Figure 10:
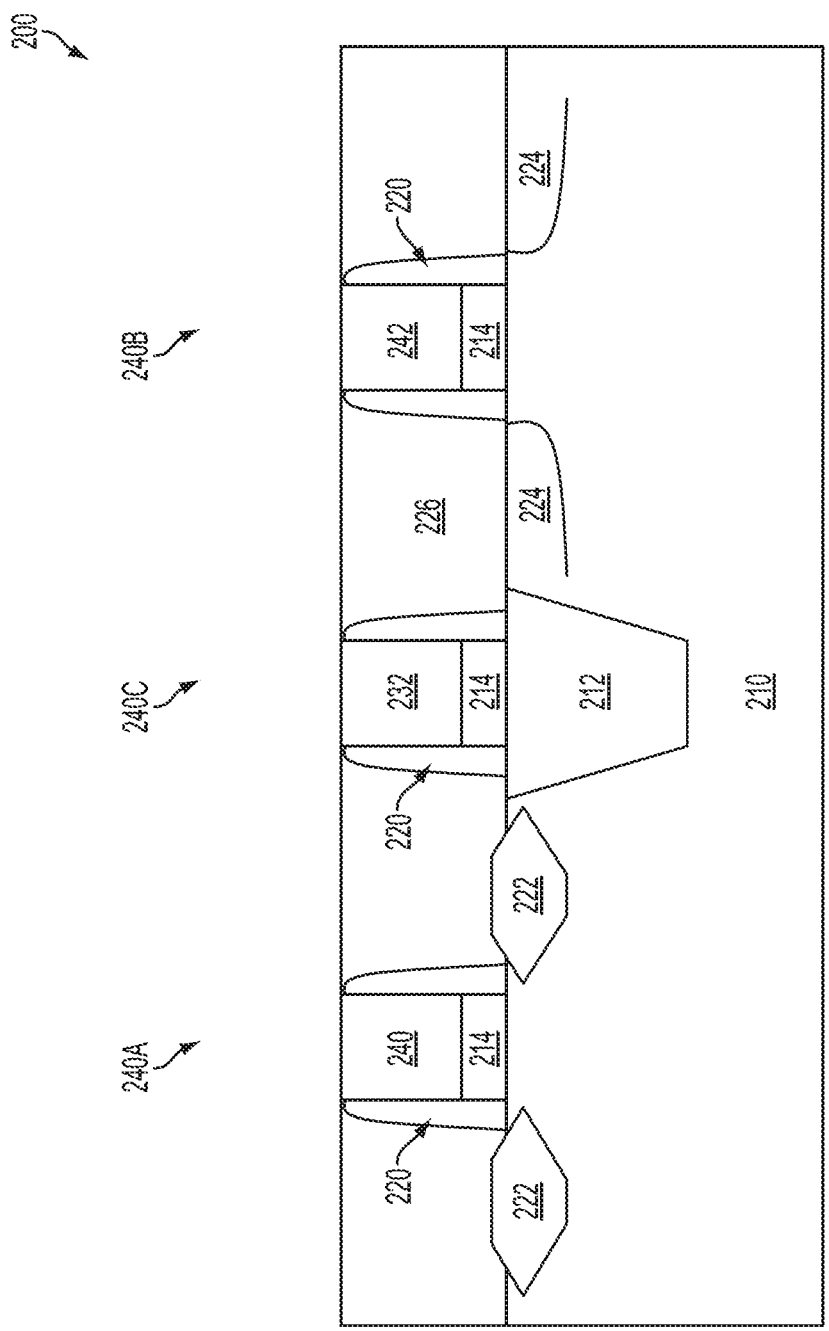
Figure 14A:
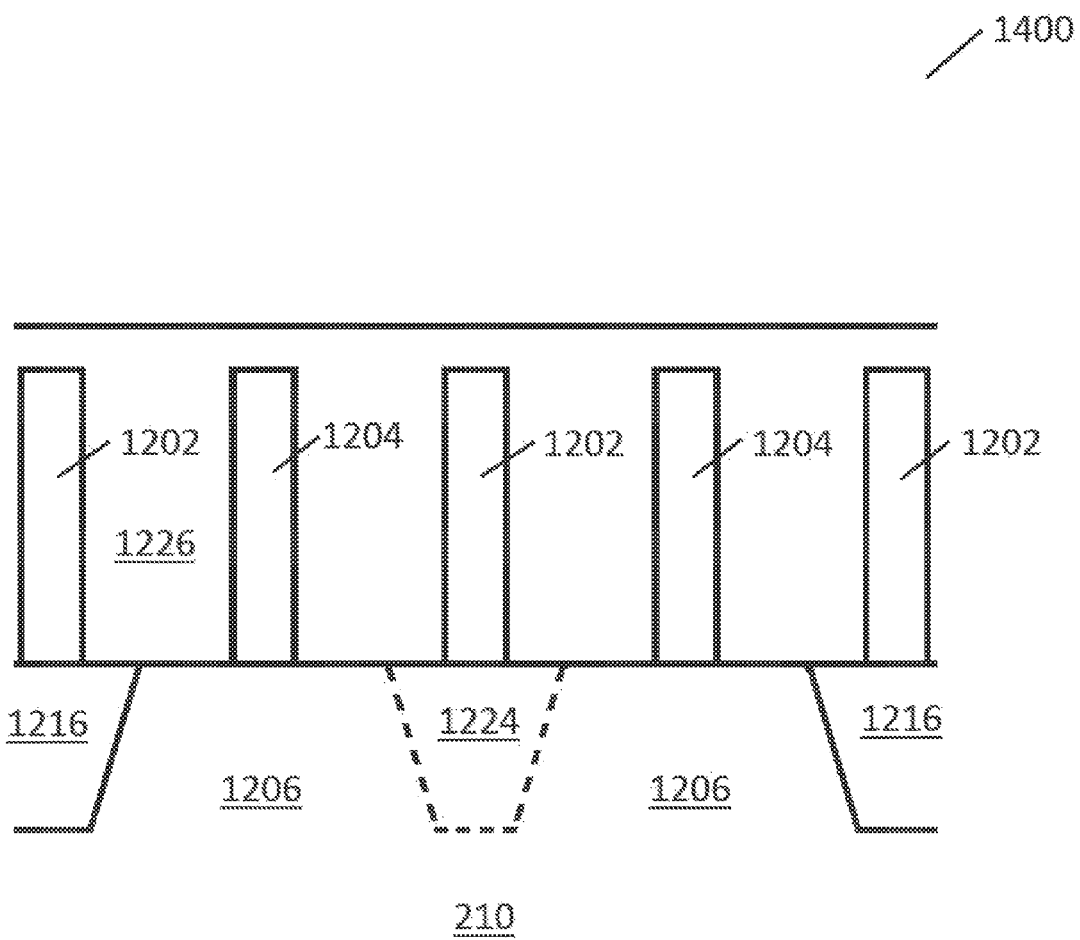
FIGS. 14A-14D are schematic cross-sectional views of metal gate electrodes of a semiconductor device at various stages of fabrication according to some embodiments.

FIG. 14A is a schematic side view of a semiconductor device 1400 in accordance with operation 1102 of method 1100 in some embodiments. First metal gate electrodes 1202 are over isolation features 1216 and, optionally, an isolation feature 1224. Second metal gate electrodes 1204 are over active regions 1206. An ILD 1226 fills spaces between first metal gate electrodes 1202 and second metal gate electrodes 1204. In some embodiments, ILD 1226 is similar to ILD 226, and is formed as described above with reference to method 100 (FIG. 1) and semiconductor device 200 (FIG. 10).

Figure 15A:
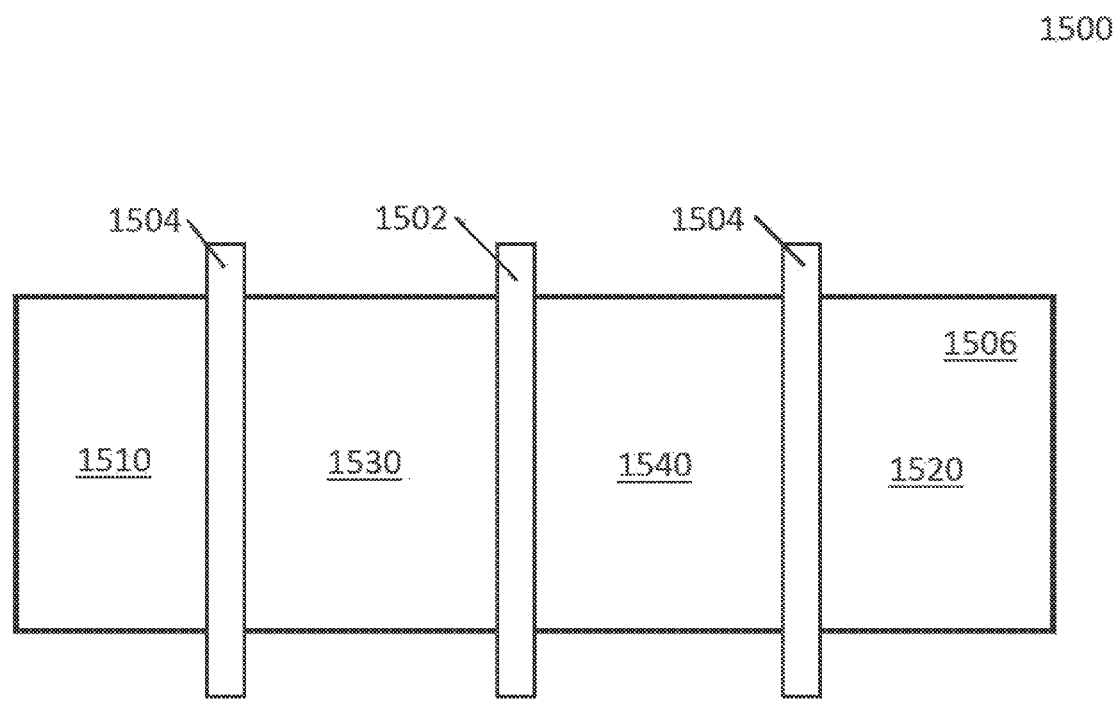
FIGS. 15A-15D are schematic top views of metal gate electrodes of a semiconductor device at various stages of fabrication according to some embodiments.

FIG. 15A is a schematic top view of a semiconductor device 1500 in accordance with operation 1102 of method 1100 in some embodiments. Semiconductor device 1500 includes a first metal gate electrode 1502 between two second metal gate electrodes 1504, and an active region 1506. Active region 1506 includes a first S/D feature 1510, a second S/D feature 1520, a third S/D feature 1530, and a fourth S/D feature 1540. First metal gate electrode 1502 is over a junction in active region 1506 at which third S/D feature 1530 and fourth S/D feature 1540 abut. In some embodiments, first S/D feature 1510 and second S/D feature 1520 are source features, third S/D feature 1530 and fourth S/D feature 1540 are drain features, and drain features abut at the junction. In some embodiments, first S/D feature 1510 and second S/D feature 1520 are drain features, third S/D feature 1530 and fourth S/D feature 1540 are source features, and source features abut at the junction. In some embodiments, one of third S/D feature 1530 or fourth S/D feature 1540 is a source feature and the other of third S/D feature 1530 or fourth S/D feature 1540 is a drain feature, and a source feature and a drain feature abut at the junction.

Returning to FIG. 11, method 1100 continues with operation 1104, which includes covering at least a portion of the second metal gate electrode with a protector. In some embodiments, the protector is a patterned photoresist, a hard mask or another suitable material. In some embodiments, a patterning process includes forming a layer of photoresist by a suitable process, such as spin-on coating, and then exposing and developing the layer of photoresist to define a photoresist feature. In some embodiments, the protector is formed to cover at least a portion of each of various active regions, isolation features, or other features of the semiconductor device.

In some embodiments, the protector is formed to cover a portion of the second metal gate electrode over an active region. In some embodiments, the protector is formed to cover an entire portion of the second metal gate electrode over an active region. In some embodiments, the protector is formed to cover an entire portion of the second metal gate electrode over an active region plus a portion of the second metal gate electrode over an isolation feature. In some embodiments, the protector is formed to leave a portion of the second metal gate electrode over an isolation feature exposed.

In some embodiments, the portion of the second metal gate electrode over an isolation feature covered by the protector defines an end cap of the second metal gate electrode. In some embodiments, the end cap extends a predetermined distance from an edge of an active region along the portion of the second metal gate electrode over an isolation feature. In some embodiments, the predetermined distance from the edge of the active area over the isolation feature ranges from about 5 nanometers (nm) to about 100 nm.

In some embodiments, a portion of the first metal gate electrode is covered by the protector. In some embodiments, the first metal gate electrode is completed exposed by the protector. In some embodiments, the protector is used to define a cut-metal area of the semiconductor device in which no metal is included in a layer corresponding to the first metal gate electrode and the second metal gate electrode.

Figure 12B:
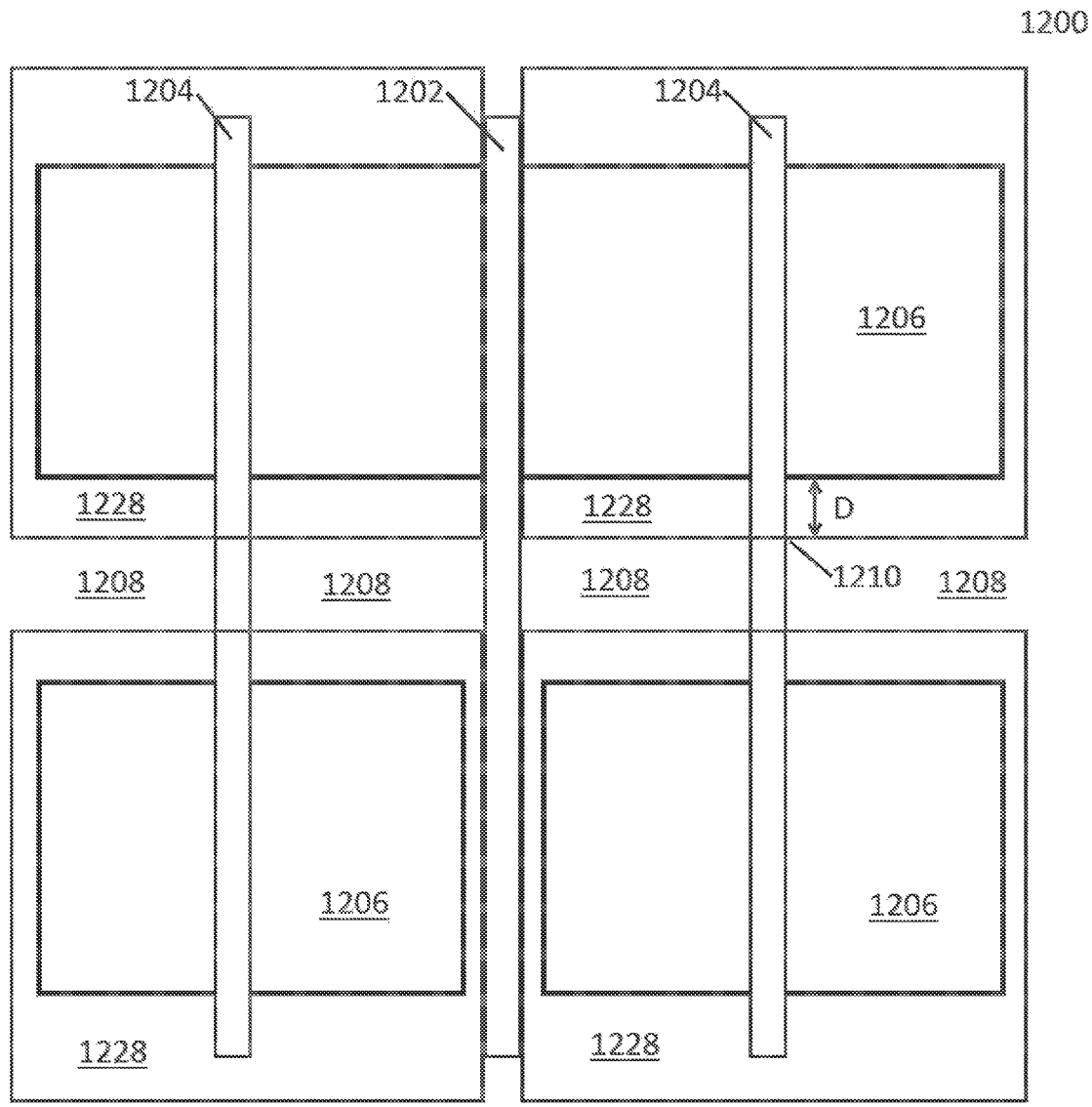

FIG. 12B is a schematic top view of semiconductor device 1200 in accordance with operation 1104 of method 1100 in some embodiments. A protector 1228 (represented by dashed lines) is over portions of second metal gate electrodes 1204, including the entire portions of second metal gate electrodes 1204 over active regions 1206. Protector 1228 is also over portions of second metal gate electrodes 1204 that are not over active regions 1206. Additional portions of second metal gate electrodes not over active areas 1206 are exposed by protector 1228.

A portion of a second metal gate electrode 1204 covered by protector 1228 extends beyond an active region 1206 by a distance D. This portion of the second metal gate electrode 1204 defines end cap 1210 at distance D from an edge of the active region 1206. In some embodiments, D ranges from about 5 nm to about 100 nm.

First metal gate electrode 1202 is exposed by protector 1228. A cut-metal area 1208 is formed by gaps in protector 1228. In some embodiments, first metal gate electrode 1202 and cut-metal area 1208 are a continuous area uncovered by protector 1228.

Figure 13B:
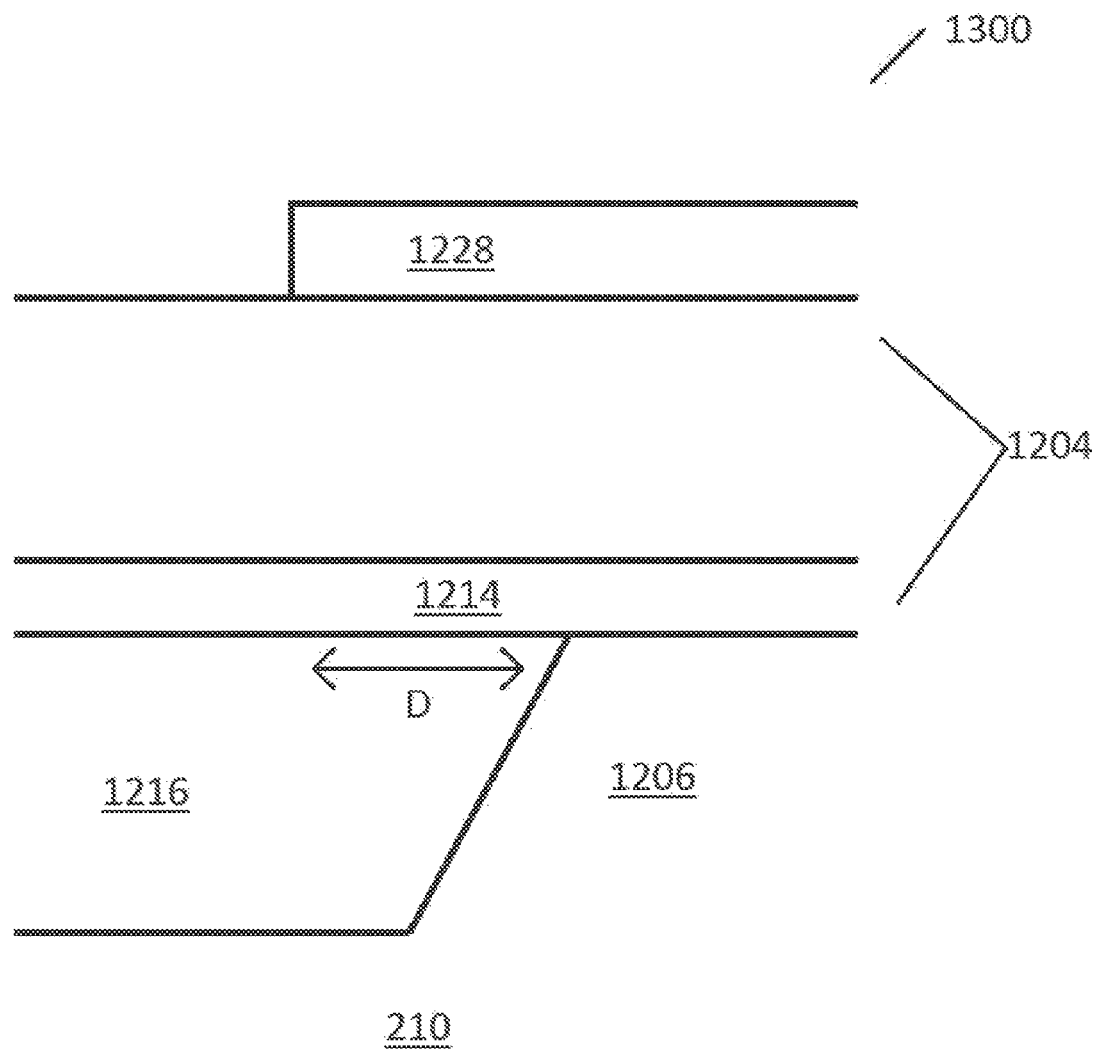

FIG. 13B is a schematic side view of portion 1300 of semiconductor device 1200 in accordance with operation 1104 of method 1100 in some embodiments. The portion of second metal gate electrode 1204 covered by protector 1228 extends beyond active area 1206 by distance D.

Figure 14B:
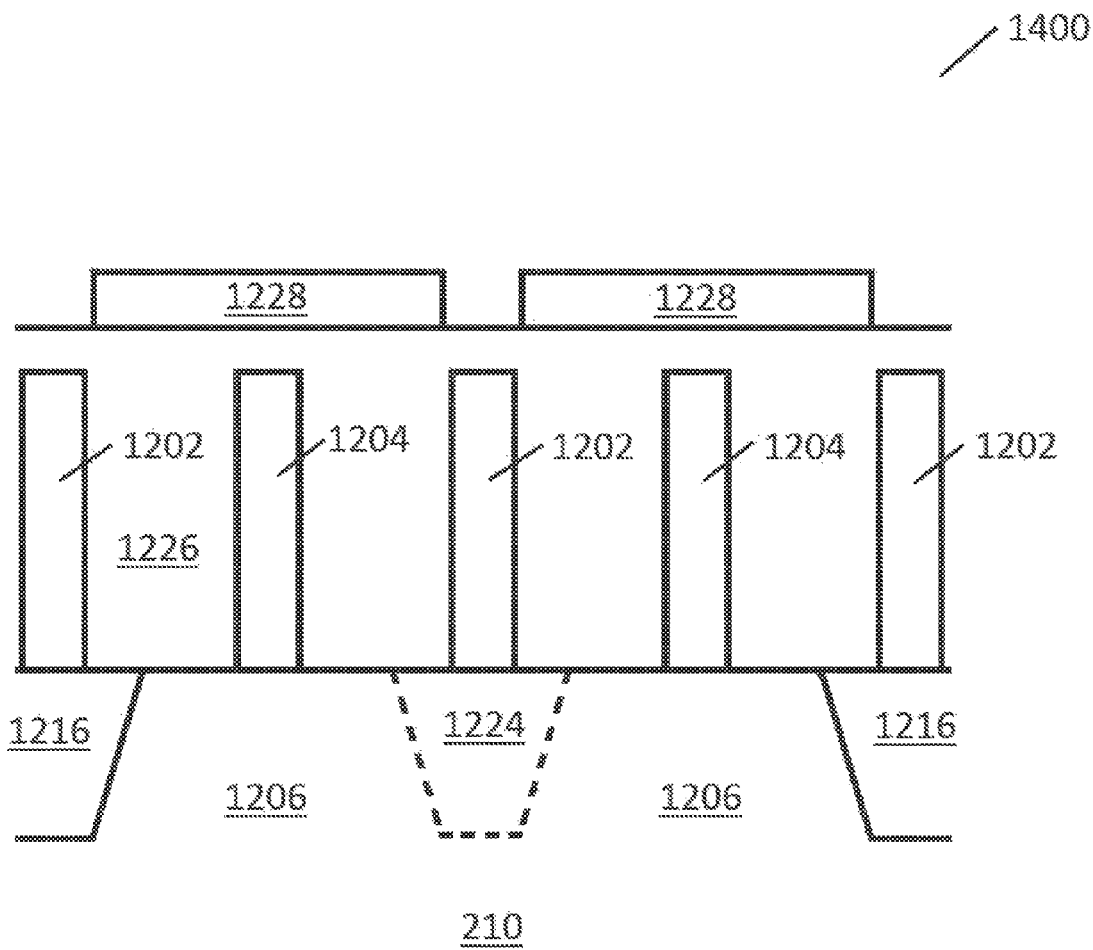

FIG. 14B is a schematic side view of semiconductor device 1400 in accordance with operation 1104 of method 1100 in some embodiments. Protector 1228 covers second metal gate electrodes 1204 over active regions 1206 and leaves first metal gate electrodes 1202 exposed.

Figure 15B:
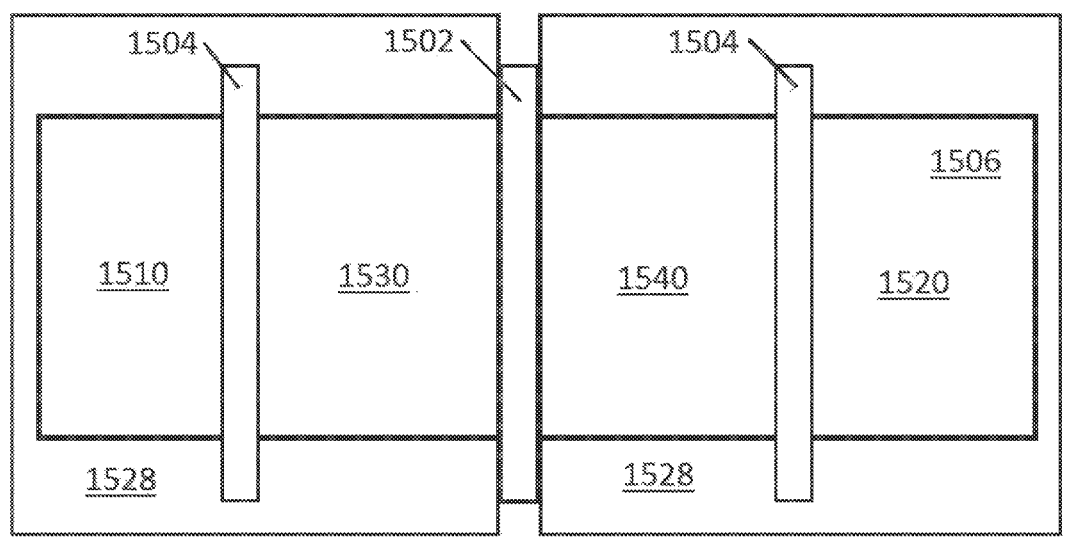

FIG. 15B is a schematic top view of semiconductor device 1500 in accordance with operation 1104 of method 1100 in some embodiments. Protector 1528 (represented by dashed lines) covers second metal gate electrodes 1504 over active region 1506 and leaves first metal gate electrode 1502 exposed.

Returning to FIG. 11, method 1100 continues with operation 1106, which includes removing at least a portion of the first metal gate electrode to form a first opening, and removing the uncovered portion of the second metal gate electrode to form a second opening. In some embodiments, an entirety of the first metal gate electrode is removed.

In some embodiments, removing at least a portion of first metal gate electrode 1202 and/or the uncovered portion of metal gate electrode 1204 comprises removing the work function layer. In some embodiments, a metal gate electrode is removed by an etching process, e.g., a dry etching process, a wet etching process, a reactive ion etching (RIE) process, or another suitable etching process.

Figure 12C:
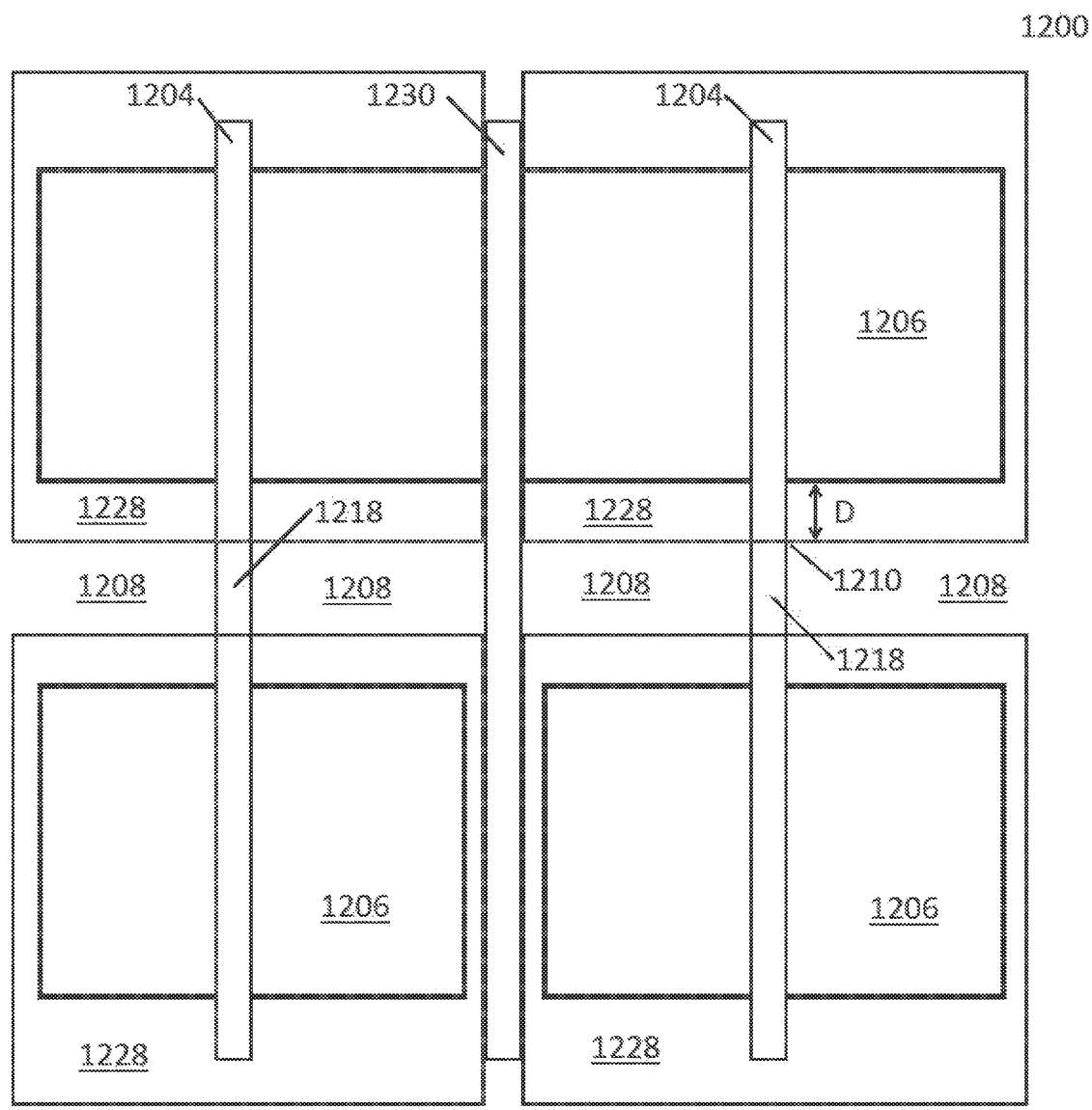

FIG. 12C is a schematic top view of semiconductor device 1200 in accordance with operation 1106 of method 1100 in some embodiments. A first opening 1230 is located in the area in which first metal gate electrode 1202 was removed, and second openings 1218 are located in the areas in which portions of second metal gate electrodes 1204 exposed by protector 1228 were removed.

Figure 13C:
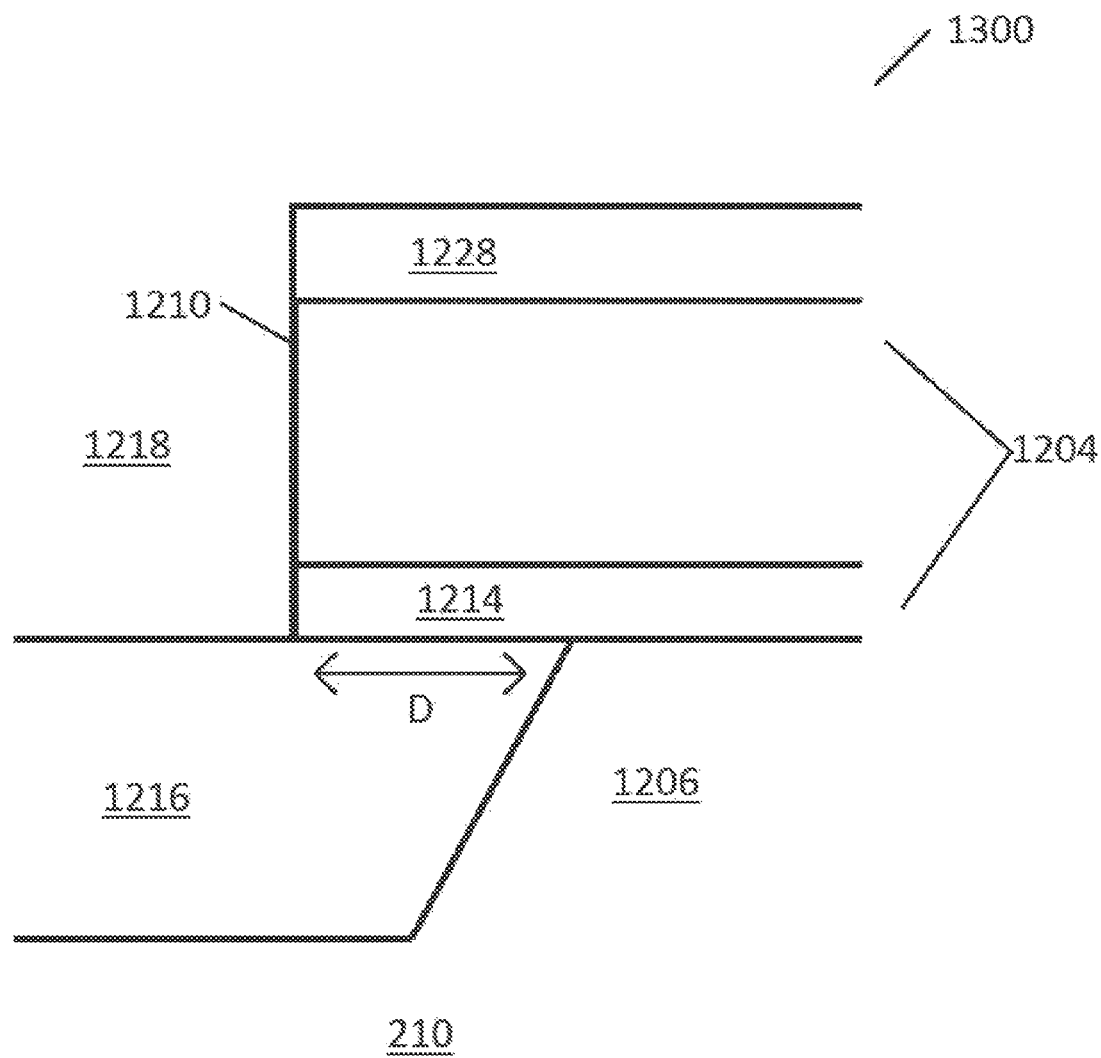

FIG. 13C is a schematic side view of portion 1300 of semiconductor device 1200 in accordance with operation 1106 of method 1100 in some embodiments. Second opening 1218 is located in the area in which the portion of second metal gate electrode 1204 exposed by protector 1228 was removed. The portion of work function layer 1214 exposed by protector 1228 was also removed. A sidewall of second opening 1218 forms end cap 1210.

Figure 14C:
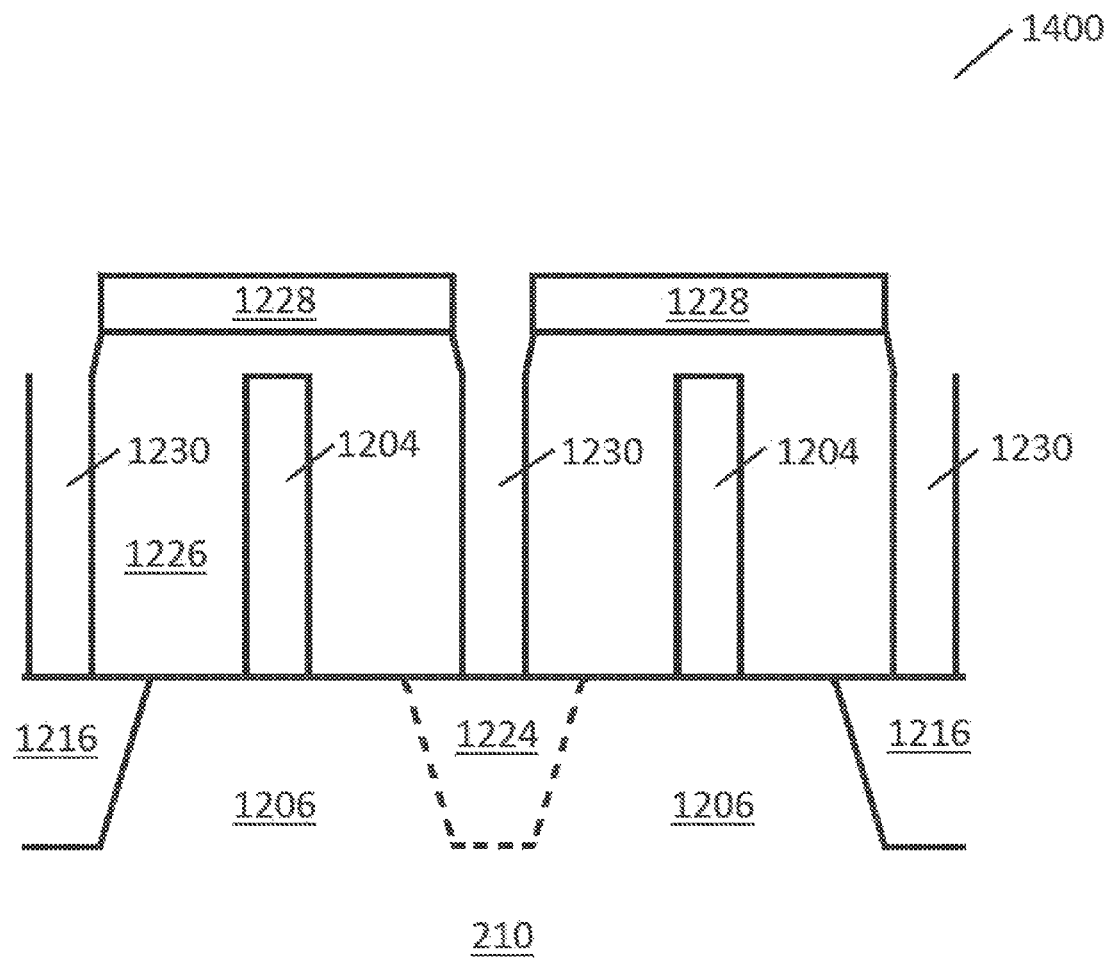

FIG. 14C is a schematic side view of semiconductor device 1400 in accordance with operation 1106 of method 1100 in some embodiments. First openings 1230 are located in the areas in which first metal gate electrodes 1202 were removed.

Figure 15C:
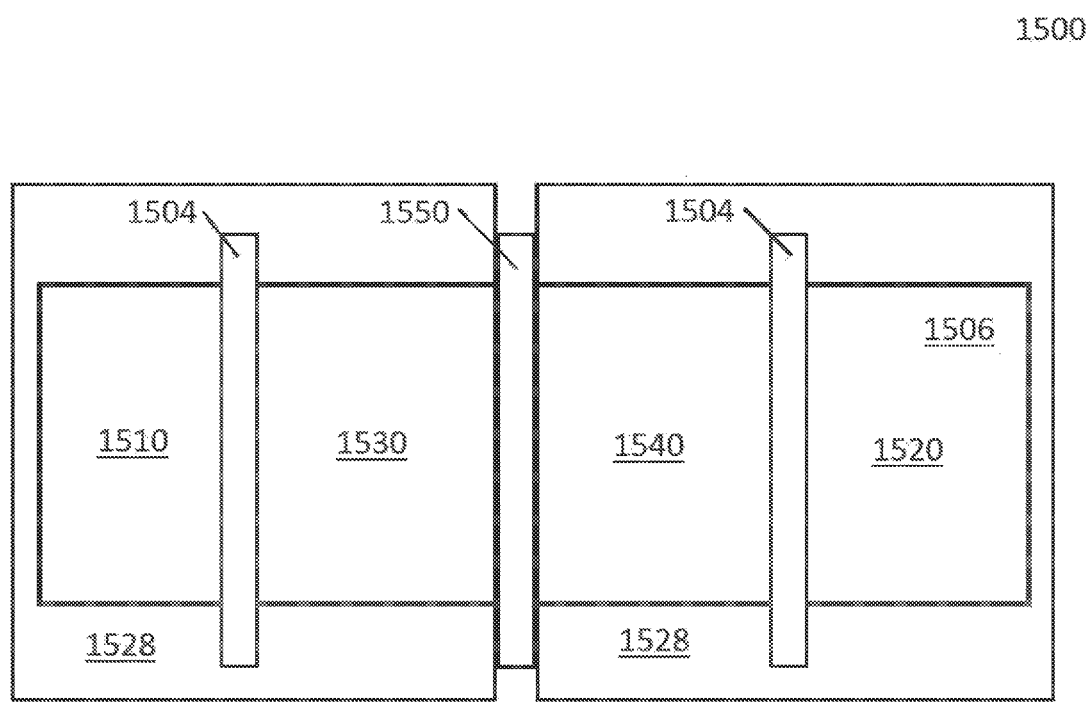

FIG. 15C is a schematic top view of semiconductor device 1500 in accordance with operation 1106 of method 1100 in some embodiments. First opening 1550 is located in the area in which first metal gate electrode 1502 was removed.

Returning to FIG. 11, method 1100 continues with operation 1108, which includes filling the first opening and the second opening with a non-conductive material. In some embodiments, the non-conductive material includes a dielectric including materials such as oxide, nitride, oxynitride, low-k dielectric material, ultra low-k dielectric material, extreme low-k dielectric material, other dielectric material, and/or combinations thereof. In some embodiments, the first opening and/or the second opening is filled with non-conductive material by a CVD process, a high-density plasma (HDP) CVD process, a high-aspect-ratio process (HARP), a spin-coating process, other deposition process, and/or any combinations thereof.

In some embodiments, the protector is removed before filling the first openings and the second opening with non-conductive material. In some embodiments, the protector is removed after filling the first opening and the second opening with the non-conductive material.

In some embodiments, filling the first opening and the second opening with the non-conductive material further comprises performing a planarizing process to remove portions of non-conductive material above the first openings, second opening, and ILD, thereby forming a substantially co-planar top surface of the semiconductor device. The planarizing process can include a chemical-mechanical polish (CMP) process, a dry etch process, a wet etch process, other suitable planarization processes and/or a combination thereof.

Figure 12D:
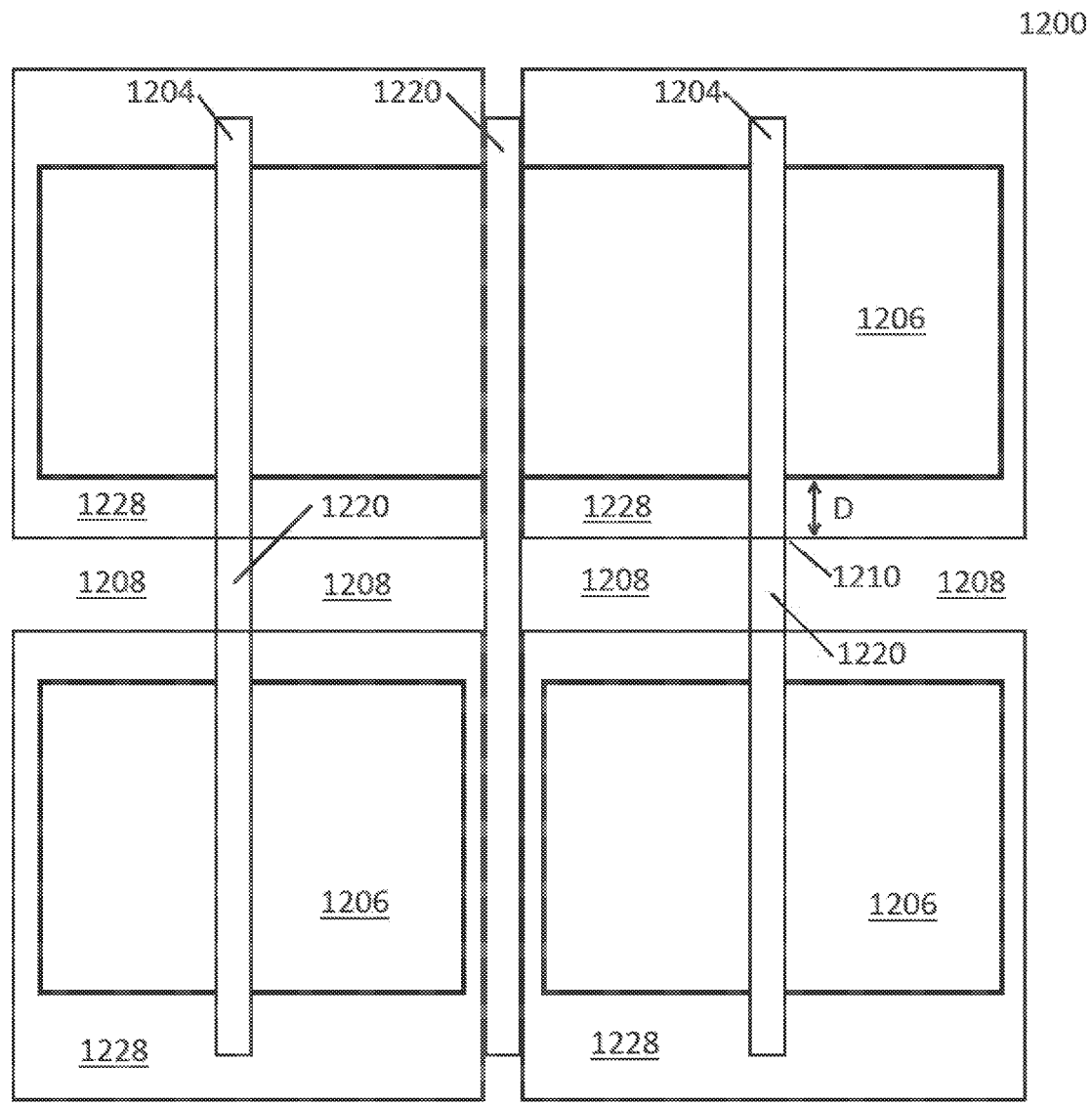

FIG. 12D is a schematic top view of semiconductor device 1200 in accordance with operation 1108 of method 1100 in some embodiments. Non-conductive material 1220 is located in the areas in which first opening 1230 and second opening 1218 have been filled.

Figure 13D:
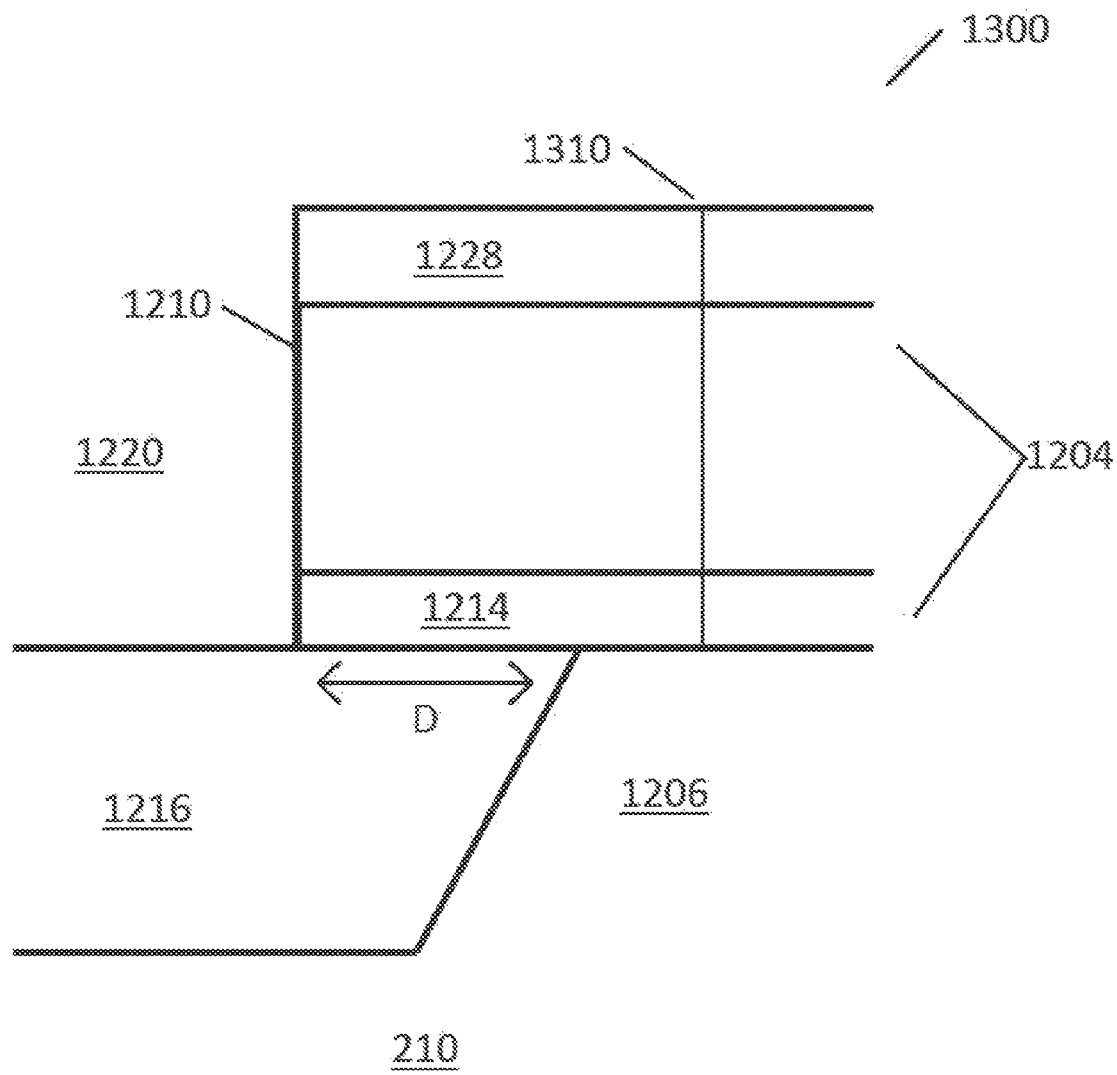

FIG. 13D is a schematic side view of portion 1300 of semiconductor device 1200 in accordance with operation 1108 of method 1100 in some embodiments. Non-conductive material 1220 is located in the area in which second opening 1218 has been filled. A vertical profile of the second metal gate electrode 1204 at end cap 1210 substantially matches a vertical profile 1310 of the second metal gate electrode 1204 in the portion over active region 1206.

Figure 14D:
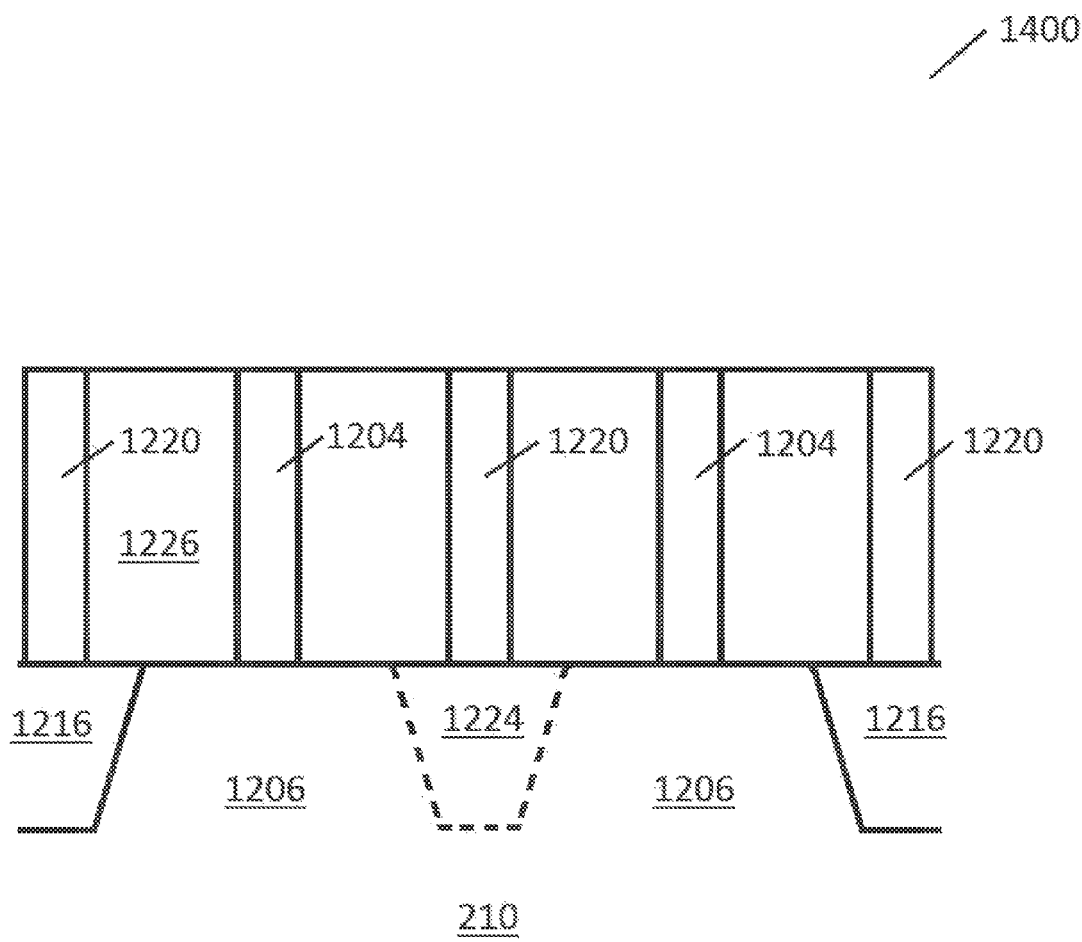

FIG. 14D is a schematic side view of semiconductor device 1400 in accordance with operation 1108 of method 1100 in some embodiments. Non-conductive material 1220 is located in the areas in which first opening 1230 has been filled. Semiconductor device 1400 has a substantially planar top surface as a result of removal of protector 1228 and a planarization process.

Figure 15D:
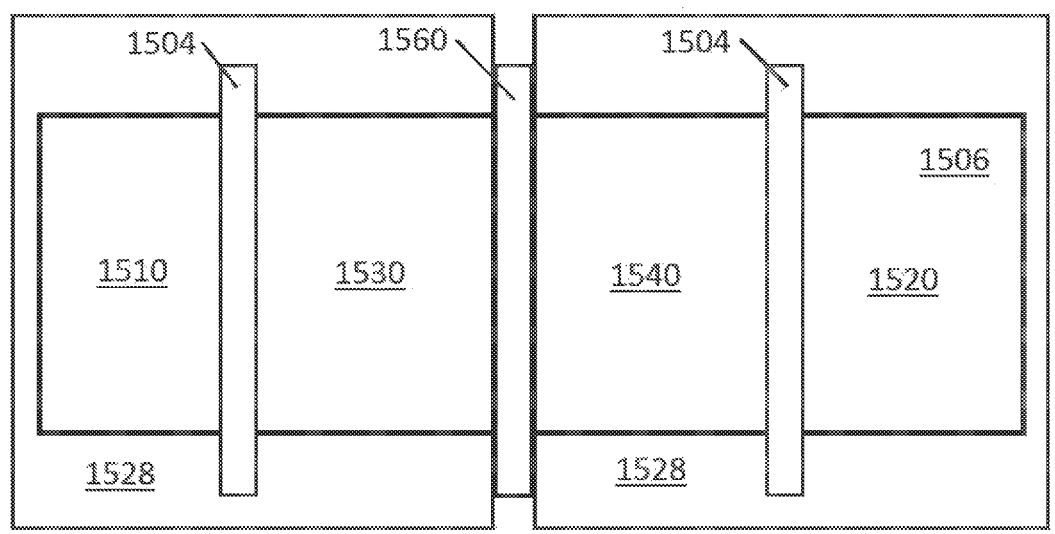

FIG. 15D is a schematic top view of semiconductor device 1500 in accordance with operation 1108 of method 1100 in some embodiments. Non-conductive material 1560 is located in the area in which first opening 1550 has been filled.

FIG. 16A is a simplified flowchart of a method 1600 of fabricating a semiconductor device according to some embodiments. In some embodiments, a semiconductor device fabricated in accordance with method 1600 is at least a portion of a microprocessor, memory cell, and/or another integrated circuit (IC) device. In some embodiments, method 1600 does not produce a completed semiconductor device. In some embodiments, a completed semiconductor device is fabricated using complementary metal-oxide-semiconductor (CMOS) technology processing. In some embodiments, additional processes are provided before, during, or after method 1600 of FIG. 16A.

FIG. 16B is a schematic top view of a semiconductor device 1610 in accordance with method 1600 in some embodiments. FIG. 16B is simplified to facilitate understanding of the present disclosure. For example, although some figures include a semiconductor device 1600, in some embodiments a complete IC comprises a number of other devices including resistors, capacitors, inductors, fuses, etc.

The various embodiments of the present disclosure discussed above offer advantages over other methods. No particular advantage is required for all embodiments, and different embodiments may offer different advantages. In at least some embodiments, spacing between adjacent two conductive gates is increased in comparison with other semiconductor devices, thereby reducing parasitic capacitance among the transistor devices. In at least some embodiments, device operation speed is enhanced to upgrade the device performance. Also, likelihood of breakdown of ILD and/or device failure is reduced in at least some embodiments. In some embodiments, a single mask is used for removal of unused metal gate electrodes and a cut metal gate process, eliminating the need for a separate mask for unused gate electrode removal. In some embodiments, end cap lengths are kept small to improve device performance, and, in some embodiments, gate stacks containing non-conductive material formed over active regions support configurations including drain/drain abutments.

In some embodiments, a semiconductor device comprises a non-conductive gate feature over a substrate, and a metal gate electrode over the substrate. The metal gate electrode comprises a portion over an active region of the substrate, and a portion over an isolation feature of the substrate ending at an end cap. A vertical profile of the metal gate electrode at the end cap matches a vertical profile of the metal gate electrode in the portion over the active region.

In some embodiments, an integrated circuit comprises a substrate having an active region and an isolation region, a metal gate electrode. A portion of the metal gate electrode is on the active region and a portion of the metal gate electrode is on the isolation region ending at an end cap, and a metal cut feature adjacent to a sidewall of the end cap. The metal gate electrode comprises a work function layer on a surface of the substrate and the sidewall of the end cap is free of the work function layer.

In some embodiments, an integrated circuit comprises a first metal gate electrode on a substrate, the first metal gate electrode having a first work function layer on a surface of the substrate, a first opening adjacent to at least one end of the first metal gate electrode, the first opening having a width substantially equal to a width of the first metal gate electrode, a second metal gate electrode on the substrate, the second metal gate electrode having a second work function layer on the surface of the substrate, and a second opening adjacent to at least on end of the second metal gate electrode, the second opening having a width substantially equal to a width of the second metal gate electrode. A first sidewall between the first metal gate electrode and the first opening is free of the first work function layer, and a second sidewall between the second metal gate electrode and the second opening is free of the second work function layer.

While the disclosure has been described by way of example and in terms of the preferred embodiments, it is to be understood that the disclosure is not limited to the disclosed embodiments. To the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A semiconductor device, comprising:
    a non-conductive gate feature over a substrate; and
    a metal gate electrode over the substrate, the metal gate electrode comprising:
        a portion over an active region of the substrate; and
        a portion over an isolation feature of the substrate ending at an end cap, wherein a vertical profile of the metal gate electrode at the end cap matches a vertical profile of the metal gate electrode in the portion over the active region.
2. The semiconductor device of claim 1, wherein:
    the non-conductive gate feature comprises a dielectric material.
3. The semiconductor device of claim 2, wherein:
    the non-conductive gate feature overlies another isolation feature of the substrate.
4. The semiconductor device of claim 1, wherein:
    the metal gate electrode comprises a work function layer configured to adjust a work function value of the metal gate electrode; and the non-conductive gate feature overlies a junction in the active region at which a first source/drain (S/D) feature abuts a second S/D feature.

5. The semiconductor device of claim 1, wherein:
a sidewall of the end cap of the metal gate electrode is free of a work function layer.

6. The semiconductor device of claim 1, further comprising:
recess cavities in the substrate, wherein the recess cavities are on opposites sides of the metal gate electrode; and
an epitaxial (epi) material in the recess cavities.

7. The semiconductor device of claim 1, further comprising:
a metal cut area adjacent to the end cap of the metal gate electrode, wherein the metal cut area has a width substantially equal to a width of the end cap, and the metal cut area is filled with a dielectric material.

8. The semiconductor device of claim 7, further comprising:
spacers on opposite sidewalls of the metal cut area.

9. An integrated circuit, comprising:
a substrate having an active region and an isolation region;
a metal gate electrode, wherein a portion of the metal gate electrode is on the active region and a portion of the metal gate electrode is on the isolation region ending at an end cap; and
a metal cut feature adjacent to a sidewall of the end cap, wherein the metal gate electrode comprises a work function layer on a surface of the substrate and the sidewall of the end cap is free of the work function layer.

10. The integrated circuit of claim 9, wherein:
the work function layer comprises TiAl or TiN.

11. The integrated circuit of claim 9, wherein:
the work function layer provides a work function value of about 4.3 eV or less.

12. The integrated circuit of claim 9, wherein:
the work function layer provides a work function value of about 5 eV or more.

13. The integrated circuit of claim 9, further comprising:
spacers extending along opposite sidewalls of the metal gate electrode and opposite sidewalls of the metal cut feature.

14. The integrated circuit of claim 9, further comprising:
a dummy gate feature on the substrate, the dummy gate feature and the metal cut feature comprise a dielectric material.

15. An integrated circuit, comprising:
a first metal gate electrode on a substrate, the first metal gate electrode having a first work function layer on a surface of the substrate;
a first opening adjacent to at least one end of the first metal gate electrode, the first opening having a width substantially equal to a width of the first metal gate electrode;
a second metal gate electrode on the substrate; the second metal gate electrode having a second work function layer on the surface of the substrate; and
a second opening adjacent to at least on end of the second metal gate electrode, the second opening having a width substantially equal to a width of the second metal gate electrode, wherein
a first sidewall between the first metal gate electrode and the first opening is free of the first work function layer, and
a second sidewall between the second metal gate electrode and the second opening is free of the second work function layer.

16. The integrated circuit of claim 15, further comprising:
a non-conductive gate feature on the substrate, wherein
the non-conductive gate feature comprises a dielectric material, and
the first opening and the second opening are partially filled with the dielectric material.

17. The integrated circuit of claim 15, further comprising:
first spacers extending along opposite sidewalls of the first metal gate electrode and opposite sidewalls of the first opening; and
second spacers extending along opposite sidewalls of the second metal gate electrode and opposite sidewalls of the second opening.

18. The integrated circuit of claim 15, wherein:
the first work function layer is an n-type work function metallic layer and the second work function layer is a p-type work function metallic layer.

19. The integrated circuit of claim 15, wherein:
the first work function layer provides a work function value of about 4.3 eV or less.

20. The integrated circuit of claim 15, wherein:
the second work function layer provides a work function value of about 5 eV or more.

* * * * *